(12) United States Patent
Kumar Agrawal et al.

(10) Patent No.: US 12,392,831 B2
(45) Date of Patent: Aug. 19, 2025

(54) ELECTRONIC DEVICES WITH MULTIPLE ENERGY STORAGE DEVICES, THERMAL MITIGATION CIRCUITS, USER INTERFACE PROMPTS, AND CORRESPONDING METHODS

(71) Applicant: Motorola Mobility LLC, Chicago, IL (US)

(72) Inventors: Amit Kumar Agrawal, Bangalore (IN); Rohit Sisodia, Naperville, IL (US)

(73) Assignee: Motorola Mobility LLC, Chicago, IL (US)

( * ) Notice: Subject to any disclaimer, the term of this patent is extended or adjusted under 35 U.S.C. 154(b) by 229 days.

(21) Appl. No.: 18/122,076

(22) Filed: Mar. 15, 2023

(65) Prior Publication Data
US 2024/0310444 A1    Sep. 19, 2024

(51) Int. Cl.
| | | |
|---|---|---|
| G01R 31/36 | (2020.01) | |
| G06F 1/16 | (2006.01) | |
| G06F 1/20 | (2006.01) | |
| G06F 1/26 | (2006.01) | |
| G06F 1/3206 | (2019.01) | |

(52) U.S. Cl.
CPC ....... *G01R 31/3646* (2019.01); *G06F 1/1616* (2013.01); *G06F 1/1635* (2013.01); *G06F 1/1677* (2013.01); *G06F 1/203* (2013.01); *G06F 1/206* (2013.01); *G06F 1/263* (2013.01); *G06F 1/3206* (2013.01); *G06F 1/1652* (2013.01)

(58) Field of Classification Search
CPC . G01R 31/3646; G06F 1/1616; G06F 1/1635; G06F 1/1677; G06F 1/203; G06F 1/206; G06F 1/263; G06F 1/3206; G06F 1/1652
See application file for complete search history.

(56) References Cited

U.S. PATENT DOCUMENTS

| | | |
|---|---|---|
| 5,744,937 A | 4/1998 | Cheon |
| 10,063,677 B2 | 8/2018 | Cavallaro et al. |
| 11,715,960 B2 * | 8/2023 | Gao .................. H02J 7/007188 320/107 |

(Continued)

OTHER PUBLICATIONS

Meira, Alexandre , "PCT Search Report", PCT/CN/2023/081636; Mailed Sep. 20, 2023.

(Continued)

*Primary Examiner* — Glenn A. Auve
(74) *Attorney, Agent, or Firm* — Philip H. Burrus, IV

(57) ABSTRACT

An electronic device included a first energy storage device coupled to a second energy storage device by a conductor. A thermal mitigation circuit, or alternatively, one or more processors, determine whether to draw more current from the first energy storage device or the second energy storage device as a function of a geometric configuration of the electronic device and a support condition of the electronic device. Current can be drawn from the second energy storage device situated in the second device housing, for example, when the electronic device is hand supported by the first device housing unless secondary factors exist. When charging states of the first energy storage device and/or second energy storage device are too low to do this, the one or more processors can present a prompt on the user interface instructing the user to turn the device over.

20 Claims, 11 Drawing Sheets

(56) References Cited

U.S. PATENT DOCUMENTS

| | | |
|---|---|---|
| 11,747,874 B2 | 9/2023 | Choi |
| 2012/0274613 A1 | 11/2012 | Ishizuka |
| 2014/0370345 A1 | 12/2014 | Maleki et al. |
| 2015/0043156 A1* | 2/2015 | Jain ..................... G06F 1/206 |
| | | 361/679.46 |
| 2018/0039310 A1 | 2/2018 | Oga |
| 2018/0059753 A1* | 3/2018 | Huang ..................... H02J 7/34 |
| 2018/0224871 A1 | 8/2018 | Sahu |
| 2019/0272020 A1* | 9/2019 | Woo .................... G06F 1/1677 |
| 2019/0305563 A1 | 10/2019 | Koki |
| 2020/0036198 A1 | 1/2020 | Kim |
| 2021/0004065 A1 | 1/2021 | Chandra |
| 2021/0320504 A1 | 10/2021 | Choi |
| 2021/0341981 A1 | 11/2021 | Files |
| 2022/0060032 A1* | 2/2022 | Jeong .................... H02J 7/0025 |
| 2022/0247190 A1* | 8/2022 | Kang .................... H02J 7/0013 |
| 2022/0255326 A1 | 8/2022 | Carlson |
| 2023/0132431 A1 | 5/2023 | Kwak |
| 2023/0269313 A1* | 8/2023 | Chang ..................... G06F 1/26 |
| | | 455/572 |
| 2024/0103592 A1 | 3/2024 | Lee |
| 2024/0310885 A1* | 9/2024 | Sisodia ................ G06F 1/3206 |
| 2025/0036184 A1* | 1/2025 | Woo .................... G06F 1/1647 |

OTHER PUBLICATIONS

Vieira, Alexandre , "PCT Search Report", PCT/CN2023/081728; Mailed Sep. 22, 2023.
Auve, Glenn A. , "Non-Final Office Action", U.S. Appl. No. 18/132,207; Filed Apr. 7, 2023; Mailed Aug. 27, 2024.

* cited by examiner

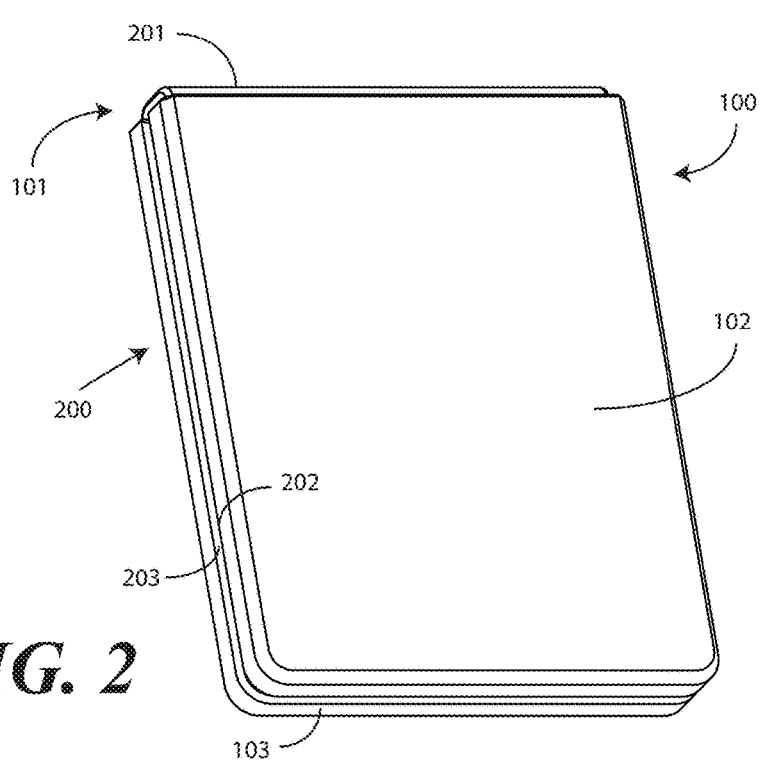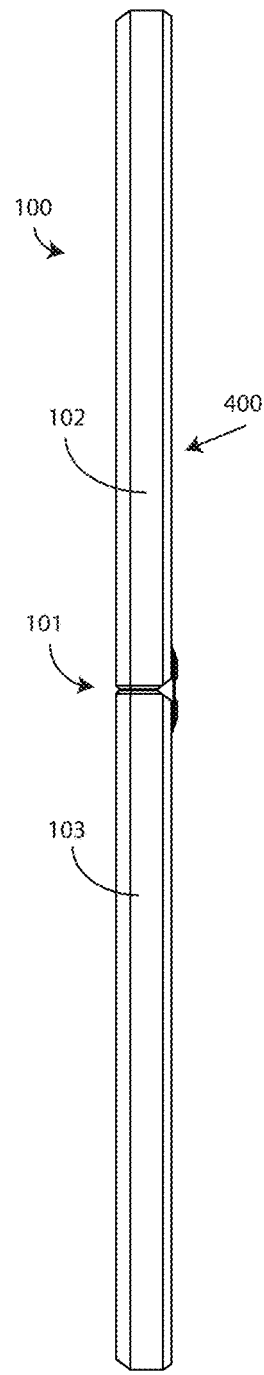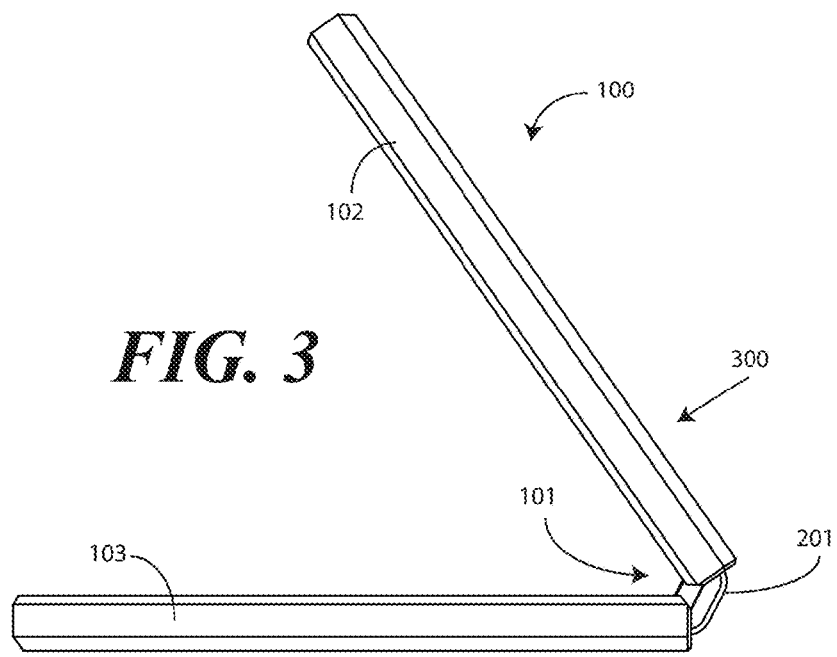
FIG. 2
FIG. 3
FIG. 4

ELECTRONIC DEVICES WITH MULTIPLE ENERGY STORAGE DEVICES, THERMAL MITIGATION CIRCUITS, USER INTERFACE PROMPTS, AND CORRESPONDING METHODS

BACKGROUND

Technical Field

This disclosure relates generally to electronic devices, and more particularly to electronic devices having multiple energy storage devices.

Background Art

Portable electronic devices such as smartphones, laptop computers, tablet computers, and two-way radios derive their portability from energy storage devices, one example of which is a rechargeable electrochemical cell. In some situations, an electronic device will include two or more rechargeable cells that are coupled together in serial or in parallel. When the energy stored within the rechargeable cells becomes depleted, it is necessary to attach a power supply to the electronic device to recharge the cells.

Electronic devices using such rechargeable cells come in different mechanical configurations. A first configuration, known as a "candy bar," is generally rectangular in shape, has a rigid form factor, and has a display disposed along a major face of the electronic device. By contrast, a "clamshell" device has a mechanical hinge that allows one housing to pivot relative to the other. Clamshell devices generally have inferior thermal dissipation performance compared to candy bar devices due to their unique design resulting in reduced thermal dissipation surface area. It would be advantageous to have an improved foldable design that mitigates such issues.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

FIG. 2 illustrates a perspective view of one explanatory electronic device in accordance with one or more embodiments of the disclosure in a closed position.

FIG. 3 illustrates a side elevation view of one explanatory electronic device in accordance with one or more embodiments of the disclosure in a partially open position.

FIG. 4 illustrates a side elevation view of one explanatory electronic device in accordance with one or more embodiments of the disclosure in an axially displaced open position.

Figure 1:
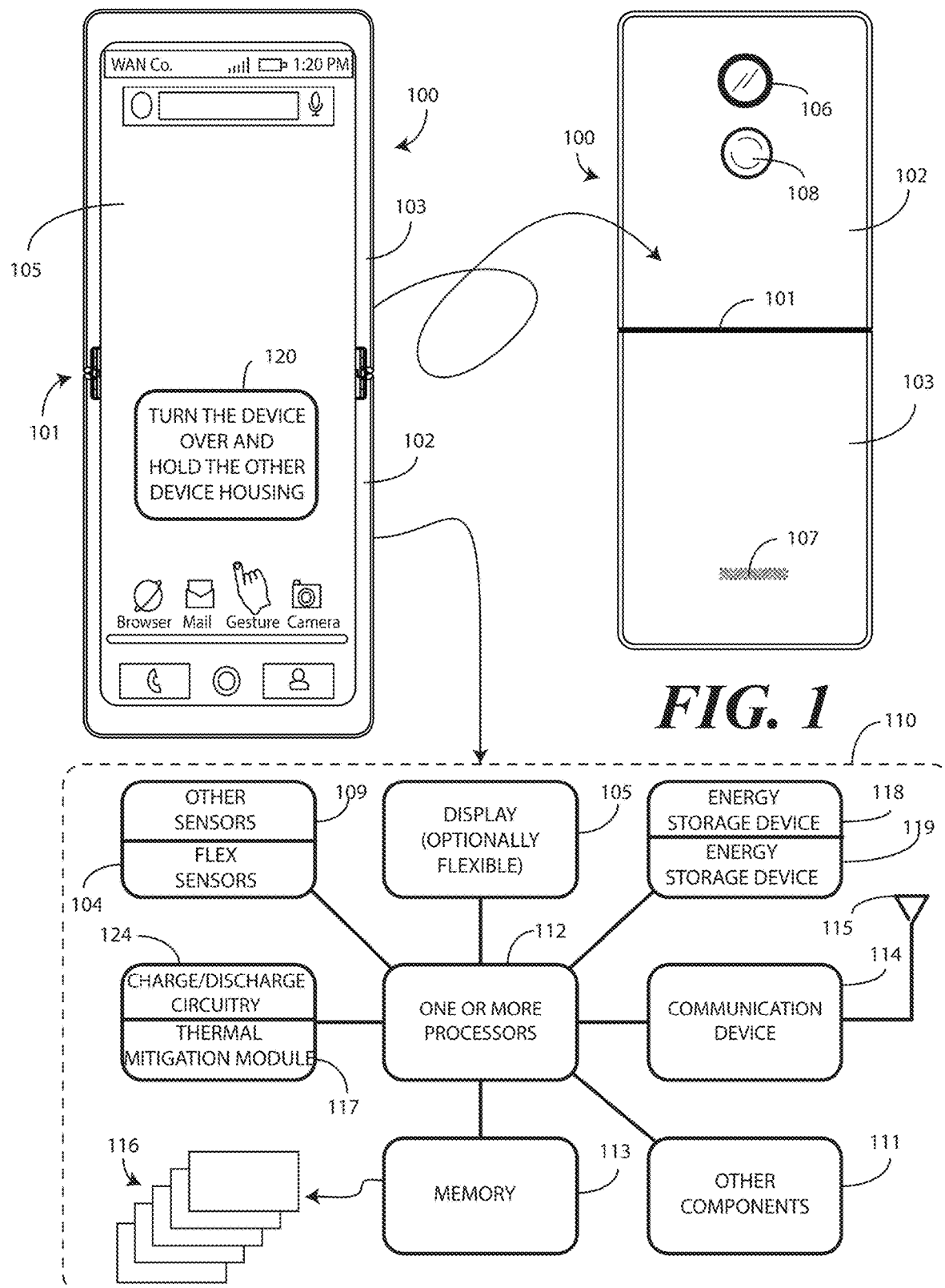
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to, in an electronic device that includes a first energy storage device situated in a first device housing and a second energy storage device situated in a second device housing, powering one or more processors of the electronic device with more current from the first energy storage device than the second energy storage device when one or more sensors of the electronic device detect a first operating condition of the electronic device, and powering the one or more processors with more current from the second energy storage device than the first energy storage device when the one or more sensors detect a second operating condition of the electronic device, and when this cannot be dune due to energy storage levels in the first energy storage device or second energy storage device, presenting a prompt on a user interface requesting the user turn the device over. Any process descriptions or blocks in flow charts should be understood as representing modules, segments, or portions of code that include one or more executable instructions for implementing specific logical functions or steps in the process.

Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or charging technology, improve the functioning of the electronic device itself by and improving the performance that can be achieved from a multiple energy storage device system in which non-zero impedances occur in circuit components coupling one energy storage device to another.

It will be appreciated that embodiments of the disclosure described herein may be comprised of one or more conventional processors and unique stored program instructions that control the one or more processors to implement, in conjunction with certain non-processor circuits, some, most, or all of the functions of determining whether to draw more current from a first energy storage device situated in a first device housing pivotable about a hinge relative to a second device housing between an axially displaced open position and a closed position or a second energy storage device situated in the second device housing as a function of a support condition of the electronic device detected by one or more sensors of the electronic device and a geometric configuration of the electronic device, and where a selected energy storage device is charged below a threshold, causing a user interface to deliver a prompt. The non-processor circuits may include, but are not limited to, a control circuit, switches, overprotection circuits, fuel gauging circuits, diodes, signal drivers, clock circuits, power source circuits, and user input devices.

As such, these functions may be interpreted as steps of a method to perform selecting a first energy storage device to power the electronic device when the one or more sensors determine the electronic device is being supported by a surface or held by the second device housing, selecting the second energy storage device to power the electronic device when the electronic device is being held by the first device housing, and causing a user interface to deliver a prompt instructing that the electronic device be supported differently when a foreground application operating on the one or more processors is orientation agnostic. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially," "essentially," "approximately," "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide circuits and methods for determining whether to draw more current from a first energy storage device situated in a first device housing pivotable about a hinge relative to a second device housing between an axially displaced open position and a closed position or a second energy storage device situated in the second device housing as a function of a support condition of the electronic device detected by one or more sensors of the electronic device and a geometric configuration of the electronic device. In one or more embodiments, and electronic device comprises a first energy storage device situated in a first device housing while a second energy storage device is situated in a second device housing. In one or more embodiments, the first device housing is pivotable about a hinge relative to the second device housing between an axially displaced open position and a closed position.

In one or more embodiments, a thermal mitigation circuit is operable with the first energy storage device and the second energy storage device. In one or more embodiments, the thermal mitigation circuit powers the one or more processors of the electronic device with more current from the first energy storage device than the second energy storage device when one or more sensors of the electronic device detect a first operating condition of the electronic device. Alternatively, the thermal mitigation circuit powers the one or more processors with more current from the second energy storage device than the first energy storage device when the one or more sensors detect a second operating condition of the electronic device.

Embodiments of the disclosure contemplate that the desired mode of operation, e.g., drawing current from a device housing that is other than the device housing being held, will not always be possible. Illustrating by example, when the first operating condition is occurring it is possible that the first energy storage device will eb charged less than a minimum first energy storage device charge threshold. Similarly, when the second operating condition is occurring, it is possible that the second energy storage device is charged less than a minimum second energy storage device charge threshold.

Where these situations exist, embodiments of the disclosure contemplate it would be beneficial to ask the user to simply hold the device by the other device housing so that the device housing having the energy storage device delivering current to power the electronic device is in the device housing not being held. In one or more embodiments, to accomplish this the one or more processors cause the user interface to deliver a prompt. The one or more processors may do this by causing a display to present the prompt on the display in one or more embodiments. Alternatively, the one or more processors may cause an audio output to audibly emanate the prompt.

In one or more embodiments, the prompt instructs that the electronic device should be held by a different device housing. Illustrating by example, when the first operating condition comprises the electronic device being held by, or held predominantly by, the second device housing when the electronic device is in the axially displaced open position, the prompt may instruct that the electronic device should be held by the first device housing. Similarly, when the second operating condition comprises the electronic device being held by, or held predominantly by, the first device housing when the electronic device is in the axially displaced open position, the prompt instructs that the electronic device should be held by the second device housing.

In still other embodiments, the prompt can instruct that the electronic device should be turned over. Similarly, in other embodiments the prompt may instruct that the orientation of the electronic device should be changed from a portrait orientation to a landscape orientation, or vice versa. In one or more embodiments, the one or more processors cause the user interface to deliver the prompt only when a foreground application operating on the one or more processors is orientation agnostic. As used herein, an "orientation agnostic" application means that the application can render the same content, without modification distorting the content (such as cropping, stretching, and so forth) regardless of device orientation. Orientation agnostic also means that input devices operable with, or used by, the application will not be impeded if the orientation or support condition is changed as well.

Illustrating by example, in one or more embodiments an application is orientation agnostic when operation of one or more of a camera, microphone, or speaker will not be impeded when the electronic device is supported differently in accordance with instructions from the prompt. For instance, if a first device housing supports a camera being used by a videoconferencing application, and a user is holding the electronic device by the second device housing, conceivably holding the electronic device by the first device housing will block the imager being from being successfully used by the videoconferencing application. Accordingly, even if the videoconferencing application is capable of presenting content either in the landscape orientation or portrait orientation, it would not be orientation agnostic due to the fact that the camera it requires for operation would be occluded if the electronic device were being held by the device housing supporting the camera.

A video streaming application capable of streaming a selected video both when the electronic device is in the portrait orientation or the landscape orientation would be orientation agnostic, provided that the loudspeakers being used for audio accompanying the video were not occluded when the orientation was changed. By contrast, a gaming application that can only present content in the landscape orientation would not be orientation agnostic. It would instead be orientation sacrosanct since the content is only presented in one orientation. An application that had to cut, crop, stretch, or deform content when the electronic device changed orientations would also be orientation sacrosanct. An application that could only receive audio content from a microphone when in one geometric orientation would be orientation sacrosanct, and so forth.

In one or more embodiments, the prompt explains heat generation occurring in the electronic device. Illustrating by example, of the prompt says, "please hold the other device housing," it may also say, "because power for the electronic device is being drawn from an energy storage device in the device housing you're currently holding, which might start to get warm."

In one or more embodiments, one or both of the first operating condition or the second operating condition comprises a mechanical support condition of the electronic device. The first operating condition and/or second operating condition can also comprise a mechanical configuration of the electronic device, e.g., whether the electronic device is in the axially displaced open position, the closed position, or in a position therebetween.

Illustrating by example, the first operating condition can comprise the electronic device being held by, or held predominantly by, the second device housing when the electronic device is in the axially displaced open position. Similarly, the second operating condition can comprise the electronic device being held by, or predominantly held by, the first device housing when the electronic device is in the axially displaced open position.

As used herein, "predominantly" takes the plain, ordinary, English definition of "mainly, for the most part." Thus, if a person is holding the electronic device with a single hand where seventy percent, seventy-five percent, eighty percent, eighty-five percent, ninety percent, or ninety-five percent of the single hand contacts the first device housing, the person would be "predominantly" holding the electronic device by the first device housing.

To illustrate with another example, in one or more embodiments the first operating condition may comprise the electronic device being held by, or held predominantly by, the second device housing when the electronic device is in the axially displaced open position. The second operating condition may then comprise the electronic device being supported by a surface, regardless of whether the electronic device is in the axially displaced open position or the closed position.

By selecting from which energy storage device to draw current, the thermal mitigation circuit can affect the overall temperature of the electronic device. For instance, when the thermal mitigation circuit draws more current from the first energy storage device situated in the first device housing than the second energy storage device situated in the second device housing, this generally will cause the first device housing to be hotter than the second energy storage device. By making this choice when the electronic device is held by, or held predominantly by, the second device housing, this allows the second device housing to stay cooler than the first device housing, thereby keeping the device housing being held by the user at a lower temperature for more comfort.

However, when the first energy storage device is charged less than a minimum first energy storage device charge threshold when the one or more sensors detect the first operating condition, or alternatively when the second energy storage device is charged less than a minimum second energy storage device charge threshold when the one or more sensors detect the second operating condition, the one or more processors can cause the user interface to deliver the prompt. The prompt, which may be and audio notification, visual notification, haptic notification, or other type of notification, can then instruct the user to hold the electronic device in an alternate way to mitigate thermal issues occurring with the electronic device. The presentation of the prompt advantageously allows the user to continue to use the electronic device without having to tolerate increased temperatures of a device housing being held when current is being drawn, or predominantly drawn, from an energy storage device in that device housing.

Some use cases help to illustrate this advantage. In one or more embodiments, when the electronic device is being held in a portrait orientation, one or more sensors of the electronic device can determine if the electronic device is being held by the bottom device housing. When this occurs, the thermal mitigation circuit can cause more current to be drawn from the energy storage device situated in the upper device housing, provided the energy storage device in the upper device housing is charged above a minimum energy storage device charge threshold. If it is not, the one or more processors can present a prompt on the user interface asking the user to hold the upper device housing, and optionally to turn the electronic device to a landscape orientation.

By contrast, if the electronic device is being held by the upper device housing, the thermal mitigation circuit can cause more current to be drawn from the energy storage device situated in the lower device housing so long as the energy storage device in the lower device housing is charged beyond an energy storage device charge threshold. Otherwise, the one or more processors can cause delivery of a prompt asking the user to hold the bottom device housing.

When the electronic device is in a landscape orientation or is not being held by a hand, the thermal mitigation circuit may cause an equal amount of current to be drawn from the first energy storage device and second energy storage device to power the one or more processors. In another use case, when the electronic device is not connected to a charger and is being supported by a surface, the thermal mitigation circuit may cause an equal amount of current to be drawn from the first energy storage device and second energy storage device to power the one or more processors. There is no need for a prompt in these two use cases because the surface is not sensitive to heat.

When the electronic device is connected to a charger, the thermal mitigation circuit may work in reverse, causing more charging current to be delivered to the energy storage device situated in the device housing that is not being held. When the energy storage device in the device housing not being held is fully, or substantially fully, charged, however, in one or more embodiments the one or more processors deliver a prompt instructing the user to hold the electronic device differently so that the energy storage device in the device housing presently being held can be charged without warming the user's hand.

Accordingly, in another use case when the electronic device is connected to a charger and is being by supported by a surface, the thermal mitigation circuit may cause the energy storage device having the lowest state of charge to receive the most charging current first. If the user is holding the device housing in which that energy storage device is situated, the one or more processors may present a prompt asking the user to hold the other device housing before charging commences. Once both energy storage devices reach the same state of charge, the thermal mitigation circuit may cause current to be delivered to both the first energy storage device and the second energy storage device equally.

In another use case when the electronic device is connected to a charger and is being supported by a hand, the one or more sensors may determine whether the electronic device is being held by, or held predominantly by, the first device housing or the second device housing. The thermal mitigation circuit can then deliver charging current to the energy storage device situated in the device housing that is not being held or held predominantly. When the energy storage device in the device housing not being held is fully charged, a prompt can be presented asking the user to hold that device housing so the other energy storage device can be charged without warming the user's hand.

When no charger is connected, the thermal mitigation circuit can also perform balancing operations. Illustrating by example, when the electronic device is not connected to a charger and is not being used, i.e., when the deformable electronic device is idle, the thermal mitigation circuit can charge the energy storage device situated in the top device housing (which is frequently smaller in capacity that the energy storage device situated in the base) by delivering current from the energy storage device situated in the base to the energy storage device situated in the "flip," which is how many refer to the upper device housing. If the user is holding the flip, a prompt can be presented asking the user to hold the other device housing. In so doing, the thermal mitigation circuit prepares the battery in the flip for situations in which the electronic device is being held by the base, which is frequently the most natural way to hold the electronic device.

In effect, embodiments of the disclosure optimize the current drawn from each of the energy storage devices in a multi-energy storage device/multi-device housing electronic device as a function of device position (surface supported or hand supported), device orientation (landscape or portrait), device foldable state (flip open or close), and hand support detection on specific device housing (hand support on flip housing or base housing) so long as energy storage levels allow for these operations. For instance, embodiments of the disclosure determine whether to draw more current from a first energy storage device situated in a first device housing pivotable about a hinge relative to a second device housing between an axially displaced open position and a closed position or a second energy storage device situated in the second device housing as a function of a support condition of the electronic device detected by one or more sensors of the electronic device and a geometric configuration of the electronic device. This allows the device housing not being held by the user to get hotter, while the device housing being held by the user stays cooler. If the selected energy storage device is charged below an energy storage device charge threshold, however, a prompt can be presented asking the user to hold the electronic device differently.

In one or more embodiments, an electronic device comprises a first device housing coupled to a second device housing by a hinge. In one or more embodiments, the first device housing is pivotable about the hinge relative to the second device housing between an axially displaced open position and a closed position.

In one or more embodiments, the electronic device comprises a first energy storage device situated in the first device housing and a second energy storage device situated in the second device housing. One or more processors operable to perform functions of the electronic device and one or more sensors operable with the one or more processors are powered by the first energy storage device and/or second energy storage device.

In one or more embodiments, the one or more processors select the first energy storage device to power the electronic device when the one or more sensors determine the electronic device is being supported by a surface or held by the second device housing and the first energy storage device is charged beyond a predefined charge threshold. Alternatively, the one or more processors select the second energy storage device to power the electronic device when the electronic device is being held by the first device housing and the second energy storage device is charged beyond another predefined charge threshold. This helps to keep the portion of the electronic device being held by a user nice and cool.

However, the one or more processors can cause the user interface to deliver a prompt instructing the electronic device be supported differently when a foreground application operating on the one or more processors is orientation agnostic. If the foreground application is not orientation agnostic, and is instead orientation sacrosanct, the prompt can explain heat generation within the electronic device. Thus, if the first energy storage device is not charged beyond the predefined charging threshold when selected, or alternatively if the second energy storage device is not charged beyond the other predefined charging threshold when selected, a prompt can be presented either asking the user to hold the electronic device differently or explaining heat generation.

Other advantages will be described below. Still others will be obvious to those of ordinary skill in the art having the benefit of this disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, gaming devices, multimedia players, and so forth. Still other types of electronic devices can be configured in accordance with one or more embodiments of the disclosure as will be readily appreciated by those of ordinary skill in the art having the benefit of this disclosure.

The electronic device 100 could take any of a variety of shapes. For explanatory purposes, the electronic device 100 is illustrated as a deformable electronic device having a first device housing 102 and a second device housing 103 coupled together by a hinge 101. This construct is used for explanatory purposes herein because it provides an illustration of how multiple energy storage devices can be arranged in the electronic device. In one or more embodiments, an electrical conductor spans the hinge to couple circuit components together.

For instance, when a first energy storage device 118 is situated within the first device housing 102, with a second energy storage device 119 situated in the second device housing 103, an electrical conductor can span the hinge 101 to couple these energy storage devices together. While a deformable device is one explanatory situation in which multiple energy storage devices situated in substantially different locations of an electronic device, others will be obvious to those of ordinary skill in the art having the benefit of this disclosure. Accordingly, the electronic device 100 of FIG. 1 is illustrative only.

In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 2, and an axially displaced open position, shown in FIG. 1 and described below with reference to FIG. 4.

In one or more embodiments the first device housing 102 and the second device housing 103 are manufactured from a rigid material such as a rigid thermoplastic, metal, or composite material, although other materials can be used. Still other constructs will be obvious to those of ordinary skill in the art having the benefit of this disclosure.

In the illustrative embodiment of FIG. 1, the electronic device 100 includes a single hinge 101. However, in other embodiments two or more hinges can be incorporated into the electronic device 100 to allow it to be folded in multiple locations. Similarly, while two energy storage devices are shown in the electronic device 100 of FIG. 1, the electronic device 100 could include three or more energy storage devices as well.

This illustrative electronic device 100 of FIG. 1 includes a display 105. The display 105 can optionally be touch-sensitive. In one embodiment where the display 105 is touch-sensitive, the display 105 can serve as a primary user interface of the electronic device 100. Users can deliver user input to the display 105 of such an embodiment by delivering touch input from a finger, stylus, or other objects disposed proximately with the display 105.

In one embodiment, the display 105 is configured as an organic light emitting diode (OLED) display fabricated on a flexible plastic substrate, thereby making the display 105 a flexible display 105. This allows the display 105 to be flexible so as to deform when the first device housing 102 pivots about the hinge 101 relative to the second device housing 103. However, it should be noted that other types of displays suitable for use with the electronic device 100 will be obvious to those of ordinary skill in the art having the benefit of this disclosure. Illustrating by example, in other embodiments multiple displays can be used. For instance, a first rigid display can be coupled to the first device housing 102, while a second, separate rigid display can be coupled to the second device housing 103, with the hinge 101 separating the two displays.

Features can be incorporated into the first device housing 102 and/or the second device housing 103. Examples of such features include an image capture device 106 or an optional speaker port 107, which are shown disposed on the rear side of the electronic device 100 in this embodiment but could be placed on the front side as well.

In this illustrative embodiment, a user interface component 108, which may be a button or touch sensitive surface, can also be disposed along the rear side of the second device housing 103. As noted, any of these features are shown being disposed on the rear side of the electronic device 100 in this embodiment, but could be located elsewhere, such as on the front side in other embodiments. In other embodiments, these features may be omitted.

A block diagram schematic 110 of the electronic device 100 is also shown in FIG. 1. The block diagram schematic 110 can be configured as a printed circuit board assembly disposed within either or both of the first device housing 102 or the second device housing 103 of the electronic device 100. Various components can be electrically coupled together by conductors or a bus disposed along one or more printed circuit boards. For example, some components of the block diagram schematic 110 can be configured as a first electronic circuit fixedly situated within the first device housing 102, while other components of the block diagram schematic 110 can be configured as a second electronic circuit fixedly situated within the second device housing 103. A flexible substrate can then span the hinge 101 to electrically couple the first electronic circuit to the second electronic circuit.

In one or more embodiments, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 113, can optionally store the executable software code used by the one or more processors 112 during operation.

In this illustrative embodiment, the electronic device 100 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11, and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present prompts, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the electronic device 100 optionally includes one or more flex sensors 104, operable with the one or more processors 112, to detect a bending operation that causes the first device housing 102 to pivot about the hinge 101 relative to the second device housing 103, thereby transforming the electronic device 100 into a deformed geometry, such as that shown in FIGS. 2-3. The inclusion of flex sensors 104 is optional, and in some embodiment flex sensors 104 will not be included.

In one embodiment, the one or more processors 112 may generate commands or execute control operations based on information received from the various sensors, including the one or more flex sensors 104, the user interface, or the other sensors 109. In one embodiment, the one or more processors 112 may generate and present prompts or execute control operations based on information received from the state of charge of the first energy storage device 118 and the second energy storage device 119. Illustrating by example, if the first energy storage device 118 or second energy storage device is charged below a predefined charging threshold, the one or more processors 112 may cause the display 105 to present a prompt asking the user to hold the device differently under certain scenarios which will be described in more detail below.

The one or more processors 112 may also generate commands or execute control operations based upon information received from a combination of the one or more flex sensors 104, the user interface, the state of charge of the first energy storage device 118 and/or second energy storage device 119, or the other sensors 109. Alternatively, the one or more processors 112 can generate commands or execute control operations based upon information received from the one or more flex sensors 104 or the user interface alone. Moreover, the one or more processors 112 may process the received information alone or in combination with other data, such as the information stored in the memory 113.

The one or more other sensors 109 may include a microphone, an earpiece speaker, a second loudspeaker (disposed beneath speaker port 107), and a user interface component such as a button or touch-sensitive surface. The one or more other sensors 109 may include one or more of an accelerometer, gyroscope, image capture device, and/or display touch sensors to determine whether the electronic device 100 is being held on the base side or flip side in a portrait mode.

The one or more other sensors 109 may also include key selection sensors, proximity sensors, a touch pad sensor, a touch screen sensor, a capacitive touch sensor, and one or more switches. Touch sensors may be used to indicate whether any of the user actuation targets present on the display 105 are being actuated. Alternatively, touch sensors disposed in the electronic device 100 can be used to determine whether the electronic device 100 is being touched at side edges or major faces of the first device housing 102 or the second device housing 103. The touch sensors can include surface and/or housing capacitive sensors in one embodiment. The other sensors 109 can also include audio sensors and video sensors (such as a camera).

The other sensors 109 can also include motion detectors, such as one or more accelerometers or gyroscopes. For example, an accelerometer may be embedded in the electronic circuitry of the electronic device 100 to show vertical orientation, constant tilt and/or whether the electronic device 100 is stationary. A gyroscope can be used in a similar fashion.

Other components 111 operable with the one or more processors 112 can include output components such as video outputs, audio outputs, and/or mechanical outputs. Examples of output components include audio outputs such as speaker port 107, earpiece speaker, or other alarms and/or buzzers and/or a mechanical output component such as vibrating or motion-based mechanisms. Still other components will be obvious to those of ordinary skill in the art having the benefit of this disclosure.

In one or more embodiments, the electronic device 100 comprises a first energy storage device 118 and a second energy storage device 119. The first energy storage device 118 and the second energy storage device 119 can take a variety of forms.

In an illustrative embodiment shown below in FIG. 6, the first energy storage device 118 and the second energy storage device 119 each comprise electrochemical cells. For instance, the first energy storage device 118 and the second energy storage device 119 can each comprise a lithium-ion, lithium-polymer, or other type of rechargeable cell. Other examples of energy storage devices suitable for use with embodiments of the disclosure will be obvious to those of ordinary skill in the art having the benefit of this disclosure. For instance, in other embodiments the first energy storage device 118 and the second energy storage device 119 may be a supercapacitor, and so forth.

Embodiments of the disclosure contemplate that there are certain charging thresholds below which an energy storage device should not be discharged. Illustrating by example, using a 3.6-volt lithium-ion cell as an example, discharging the cell below a predefined discharge threshold of 3.1 volts because operation of the cell can become compromised. Similarly, it is generally not recommended to charge such a cell over 4.0 volts as cell performance can become unreliable as well. The lower charge threshold may be referred to as a "minimum energy storage device charge threshold," while the upper charge threshold may be referred to as a "maximum energy storage device charge threshold."

Accordingly, when determining whether an energy storage device can be used to power the electronic device, embodiments of the disclosure will also consider whether the cell is charged beyond a predefined charge threshold such as 3.1 volts to make sure the energy storage device is not "dead." Similarly, when charging, embodiments of the disclosure will look to see if the cell is charged beyond a predefined charging threshold, such as 3.6, 4.0, or 4.2 volts to determine whether the energy storage device is "full." When an energy storage device is selected to provide discharge current but is dead, a prompt can be presented. Similarly, when an energy storage device is selected to be charged but is full, a prompt can also be presented. Examples of this will be explained in more detail below.

In one or more embodiments, the first energy storage device 118 is situated within the first device housing 102, while the second energy storage device 119 is situated within the second device housing 103. In one or more embodiments, an electrical conductor couples the first energy storage device 118 to the second energy storage device 119 and/or the first energy storage device 118 and second energy storage device 119 to the one or more processors 112.

Charging circuitry 124 can be included to selectively charge the first energy storage device 118 and the second energy storage device 119 when depleted. In one or more embodiments, the charging circuitry 124 also includes fuel gauging circuitry capable of determining an energy storage level within either the first energy storage device 118 or the second energy storage device.

In one or more embodiments, the charging circuitry 124 comprises a charging node that is coupled to the first energy storage device 118. In one or more embodiments, the charging circuitry also includes another conductor coupling the charging node to the second energy storage device 119.

In one or more embodiments, the charging circuitry 124 includes a switch that is electrically coupled between the conductor coupling the first energy storage device 118 to the second energy storage device 119 and the second energy storage device 119. Opening the switch disconnects the conductor from the second energy storage device 119, while closing the switch couples, in one or more embodiments, the cathode of the first energy storage device 118 to the cathode of the second energy storage device 119.

In one or more embodiments, a thermal mitigation circuit 117 is operable to power the one or more processors 112 and other components of the block diagram schematic 110 from one or both if the first energy storage device 118 and/or the second energy storage device 119. Illustrating by example, in one or more embodiments the thermal mitigation circuit 117 powers the one or more processors 112 with more current from the first energy storage device 118 than the second energy storage device 119 when the one or more sensors 109 detect a first operating condition of the electronic device 100 provided the first energy storage device is charged beyond a predefined charge threshold. By contrast, the thermal mitigation circuit 117 can power the one or more processors 112 with more current form the second energy storage device 119 than the first energy storage device when the one or more sensors 109 detect a second operating condition of the electronic device 100 provided the second energy storage device 119 is charged beyond a predefined charge threshold.

Where either the first energy storage device 118 (when selected) or the second energy storage device 119 (when selected) is not charged beyond the predefined charge threshold, in one or more embodiments the one or more processors 112 can cause a user interface such as the display 105 or speaker port 107 to present a prompt 120. In the illustrative embodiment of FIG. 1, the prompt 120 is presented on the display 105. However, if the prompt 120 were an audio prompt, the one or more processors 112 may cause the speaker situated below the speaker port 107 to present the prompt as well by audibly emanating the prompt.

The illustrative prompt 120 of FIG. 1 instructs that the electronic device 100 be turned over and that the user hold the other device housing than is presently being held. If, for example, the one or more sensors 109 detect a first operating condition comprising the electronic device 100 being held by, or held predominantly by, the second device housing 103 when the electronic device 100 is in the axially displaced open position shown in FIG. 1, the prompt will instruct that the electronic device 100 be held by the first device housing 102 when the second energy storage device 119 is below the minimum energy storage device charge threshold. By contrast, when the second operating condition comprises the electronic device 100 being held by, or held predominantly by, the first device housing 102 when the electronic device 100 is in the axially displaced open position, the prompt 120 may instruct the user to hold the electronic device 100 by the second device housing 103 when the first energy storage device 118 is not charged to the minimum energy storage device charge threshold.

Examples of the first operating condition and second operating condition that cause this section of which energy storage device to power the one or more processors 112, provided the selected energy storage device is charged above a minimum charge threshold, can vary. Illustrating by example, in one or more embodiments the first operating condition comprises the electronic device 100 being held by, or held predominantly by, the second device housing 103 when the electronic device 100 is in the axially displaced open position, while the second operating condition comprises the electronic device 100 being held by, or held predominantly by, the first device housing 102 when the electronic device 100 is in the axially displaced open position.

In effect, the one or more processors 112 are powered from current from an energy storage device situated in the device housing other than the one being held provided there is sufficient energy to do so in that energy storage device. Otherwise, a prompt 120 is presented requesting that the user change the orientation, hold the device differently, or combinations thereof.

Thus, if a user is holding the first device housing 102 and the second energy storage device 119 situated in the second device housing 103 is sufficiently charged, it can power the one or more processors 112. Otherwise, a prompt 120 is presented. Likewise, if a user is holding the second device housing 103 and the first energy storage device 118 is sufficiently charged, the one or more processors 112 can be powered by the first energy storage device 118. Otherwise, a prompt 120 is presented. This works to keep the device housing the user is holding cool since the other device housing the energy storage device powering the one or more processors 112 will warm due to the discharge of current-either without the prompt 120 being presented or after the prompt 120 is presented and the user supports the electronic device 100 differently.

In other embodiments, the first operating condition comprises the electronic device 100 being held by, or held predominantly by, the second device housing 103 while the electronic device is in the axially displaced open position and the first energy storage device 118 is sufficiently charged, while the second operating condition comprises the electronic device 100 being supported by a surface. Embodiments of the disclosure contemplate that in electronic devices such as that shown in FIG. 1, it will frequently be the case that the energy storage device 118 situated in the first device housing 102 is larger than the energy storage device 119 situated in the second device housing 103 due to the fact that the second device housing 103 may have features such as the image capture device 106 or user interface component 108, or alternatively even an externally facing second display situated therein. This restricts the size of the energy storage device 119 that can situate within the second device housing 103. Thus, the maximum and minimum energy storage device charge thresholds of the first energy storage device 118 and the maximum and minimum energy storage device charge thresholds of the second energy storage device 119 may be different.

Moreover, when heating is not at issue, such as when the electronic device 100 is supported by the surface, in one or more embodiments the thermal mitigation circuit 117 draws current from the larger energy storage device 118 situated in the first device housing 102 (provided sufficiently charged) to reserve energy in the second energy storage device 119 for the frequently occurring situation when a person is holding the first device housing 102.

In still another embodiment, the first operating condition comprises the electronic device 100 being supported by a surface. The second operating condition then comprises the electronic device 100 being held while in the closed position.

In one or more embodiments, the first operating condition comprises the electronic device 100 being held by, or held predominantly by, the first device housing 102 while the electronic device 100 is in the axially displaced open position and a performance application is operating on the one or more processors 112. As used herein, a "performance application" is an application requiring a majority of the computing resources offered by the one or more processors 112. Examples of performance applications include gaming applications, cryptocurrency mining applications, and high-resolution video processing applications.

Embodiments of the disclosure contemplate that when such a performance application is operating on the one or more processors, it will be desirable to draw current from the first device housing 102 even when the user is holding the first device housing 102 because the first energy storage device 118 is generally larger than the second energy storage device 119 carried by the second device housing 103, as noted above. Accordingly, in one or more embodiments the first operating condition comprises the electronic device 100 being held by, or held predominantly by, the first device housing 102 while in an axially displaced open position with a performance application operating on the one or more processors 112.

In one or more embodiments, the second condition then comprises the electronic device 100 being held by, or held predominantly by, the second device housing 103 when a difference between a first energy storage device energy storage level and a second energy storage device energy storage level exceeds a predefined threshold. Illustrating by example, when the user is holding the second device housing 103 and the energy storage level of the first energy storage device 118 carried by the first device housing 102 is too low to power the one or more processors, the thermal mitigation circuit 117 may cause current from the second energy storage device 119 carried by the second device housing 103 despite the fact that the user is holding the second device housing 103. Despite this not being preferred, it allows the electronic device 100 to continue operation when the first energy storage device 118 is insufficiently charged to continue operations.

To prevent the user's hand from getting hot, a prompt 120 can be presented when this less-than-optimal operation occurs. In this scenario, where the electronic device 100 is held by, or held predominantly by, the second device housing 103 when the electronic device 100 is in the axially displaced open position, the prompt 120 instructs that the electronic device 100 should be held by the first device housing 102. Had the situation been reversed, with the detected condition being the electronic device being held by, or held predominantly by, the first device housing 102 when the electronic device 100 is in the axially displaced open position and the second energy storage device 119 is not charged sufficiently beyond its corresponding minimum charge threshold, the prompt 120 may instruct that the electronic device 100 be held by the second device housing 103, and so forth.

In other embodiments, such as the one shown illustratively in FIG. 1, the prompt 120 may instruct that the electronic device 100 should be turned over. In still other embodiments, the prompt 120 may instruct that an orientation of the electronic device 100 be changed from a portrait orientation to a landscape orientation, or vice versa. Of course, these instructions could be used in combination, with the prompt telling the user to both change the orientation of the electronic device 100 and hold the electronic device 100 differently as shown in FIG. 1.

In some embodiments, all current powering the one or more processors 112 and other circuit components of the block diagram schematic 110 can be drawn from a single energy storage device. Illustrating by example, in one or more embodiments the thermal mitigation circuit 117 powers the one or more processors 112 with current only from the first energy storage device 118 when the one or more sensors 109 detect the first operating condition of the electronic device. Similarly, the thermal mitigation circuit 117 can power the one or more processors 112 with current only from the second energy storage device 119 when the one or more sensors 109 detect the second operating condition of the electronic device 100.

In one or more embodiments, the one or more processors 112 cause the prompt 120 to be delivered only where a foreground application operating on the one or more processors 12 is orientation agnostic. As noted above, the foreground application can be considered orientation agnostic when device inversion leaves operation of the one or more sensors 109, which can include the image capture device 106 and the speaker under the speaker port 107, unaffected.

If the foreground application operating on the one or more processors 112 is instead orientation sacrosanct, the one or more processors 112 may instead cause the display 105, the speaker under speaker port 107, or another user interface component to deliver another prompt. The other prompt may explain heat generation within the electronic device 100. Since the electronic device 100 cannot be turned over without impacting operation of the foreground application, the other prompt may explain that the device housing being held is likely to get warm because the energy storage device in the other device housing is dead and there is a sacrosanct application currently operating in the foreground.

Charging operations can work in the same manner. For instance, in one or more embodiments the thermal mitigation circuit 117 charges the first energy storage device 118 with more current than the second energy storage device 119 when the one or more sensors 109 detect a third operating condition of the electronic device 100, provided the first energy storage device 118 is not fully charged. However, the thermal mitigation circuit 117 charges the second energy storage device 119 with more current the first energy storage device 118 when the one or more sensors 109 detect a fourth operating condition of the electronic device 100, again provided the second energy storage device 119 is not fully charged. When a selected energy storage device is fully charged, a prompt 120 can be delivered by a user interface component.

Illustrating by example, in one or more embodiments the third operating condition comprises the electronic device 100 being held by, or held predominantly by, the second device housing 103 when the electronic device 100 is in the axially displaced open position and a charger is connected to the electronic device 100 while the first energy storage device 118 is less than fully charged. In one or more embodiments, the fourth operating condition comprises the electronic device 100 being held by, or held predominantly by, the first device housing 102 when the electronic device 100 is in the axially displaced open position and connected to the charger and the second energy storage device 119 is less than fully charged. This causes the energy storage device situated in the device housing not being held to charge first, thereby warming the device housing other than the one the user is holding. When that energy storage device is sufficiently charged, the energy storage device situated in the device housing being held can be charged. A prompt 120 can then be presented asking the user to hold the electronic device 100 differently. Thus, while this will generate some heat, the user will have changed the support condition in response to the prompt 120 so as not to encounter the heat while each energy storage device is allowed to fully charge for maximum electronic device performance.

It should be noted that the thermal mitigation circuit 117 can be a stand-alone, hardware component such as an integrated circuit operable with one or more switches and/or relays to perform the operations described above. The thermal mitigation circuit 117 can be operable with the one or more processors 112. Alternatively, the functions of the thermal mitigation circuit 117 can be performed by the one or more processors 112. The thermal mitigation circuit 117 can be a hardware component of the one or more processors 112, integrated into the one or more processors 112, and so forth.

Thus, as described above, in one or more embodiments the one or more processors 112 can select between the first energy storage device 118 to power the electronic device 100 when the one or more sensors 109 determine the electronic device 100 is being supported by a surface or held by the second device housing 103. Similarly, the one or more processors 112 can select the second energy storage device 119 to power the electronic device 100 when the electronic device 100 is being held by the first device housing 100. When the selected energy storage device is not sufficiently charged to power the electronic device 100, a prompt 120 can be presented asking the user to change a support condition of the electronic device 100.

When a charger (illustrated below with reference to FIG. 6) is connected, the one or more processors 112 can select the first energy storage device 118 to be charged by the charger when the one or more sensors 109 determine the electronic device 100 is being supported by the surface or held by the second device housing 103. The one or more processors can select the second energy storage device 119 to be charged by the charger when the electronic device 100 is being held by the first device housing 100. When the selected energy storage device is fully charged, the one or more processors 112 can present a prompt 120 asking the user to change a support condition of the electronic device 100 so that the other energy storage device can be charged without subjecting the user to the heat that may be dissipated in the charging process.

It is to be understood that FIG. 1 is provided for illustrative purposes only and for illustrating components of one electronic device 100 in accordance with embodiments of the disclosure and is not intended to be a complete schematic diagram of the various components required for an electronic device. Therefore, other electronic devices in accordance with embodiments of the disclosure may include various other components not shown in FIG. 1 or may include a combination of two or more components or a division of a particular component into two or more separate components, and still be within the scope of the present disclosure.

Turning now to FIG. 2, illustrated therein is the electronic device 100 in a closed position or state. In this state, the first device housing 102 has been pivoted about the hinge 101 toward the second device housing 103 to a closed position 200. When in the closed position 200, a front surface 202 of the first device housing 102 abuts a front surface 203 of the second device housing 103.

In this illustrative embodiment, a hinge housing 201 comprising the hinge 101 is revealed when the electronic device 100 is in the closed position 200. In other embodiments, the hinge housing 201 will remain concealed when the first device housing 102 pivots about the hinge 101 relative to the second device housing 103 to the closed position 200. Effectively, in either embodiment, the first device housing 102 and the second device housing 103 are analogous to clam shells that have been shut by the claim, thereby giving rise to the "clamshell" style of device. When the clamshell opens, the display (105) is revealed.

In some embodiments, features can be included to further retain the electronic device 100 in the closed position 200. Illustrating by example, in one embodiment a mechanical latch can be included to retain the first device housing 102 and the second device housing 103 in the closed position 200. In other embodiments, magnets can be incorporated into the front surface 202 of the first device housing 102 and the front surface 203 of the second device housing 103 to retain the first device housing 102 and the second device housing 103 in the closed position 200.

In still other embodiments, frictional elements can be incorporated into the hinge 101 to retain the first device housing 102 and the second device housing 103 in a particular position. A stator motor could be integrated into the hinge 101 to perform this function as well. In other embodiments torsion springs used in combination with a cam having mechanical detents and a stator with mechanical protrusions are used to perform this function. Still other mechanical structures and devices suitable for retaining the electronic device 100 in the closed position 200 will be obvious to those of ordinary skill in the art having the benefit of this disclosure.

Turning now to FIG. 3, the electronic device 100 is shown being transitioned from the closed position (200) of FIG. 2 to a partially open position 300. Specifically, the first device housing 102 is pivoting about the hinge 101 away from the second device housing 103 toward an open position. The open position 300 shown in FIG. 3 is a "tent position." In the side elevation view of FIG. 3, the hinge housing 201 is exposed between the first device housing 102 and the second device housing 103.

Turning now to FIG. 4, illustrated therein is the electronic device 100 in an axially displaced open position 400. In the axially displaced open position 400, the first device housing 102 is rotated about the hinge 101 so as to be axially displaced 180-degrees out of phase with the second device housing 103, thereby revealing the display (105). In this illustrative embodiment, this causes the hinge housing (201) to be concealed within the first device housing 102 and second device housing 103.

In such a configuration, the first device housing 102 and the second device housing 103 effectively define a plane. Since this illustrative embodiment includes a flexible display, the flexible display has been elongated into a flat position.

Figure 5:
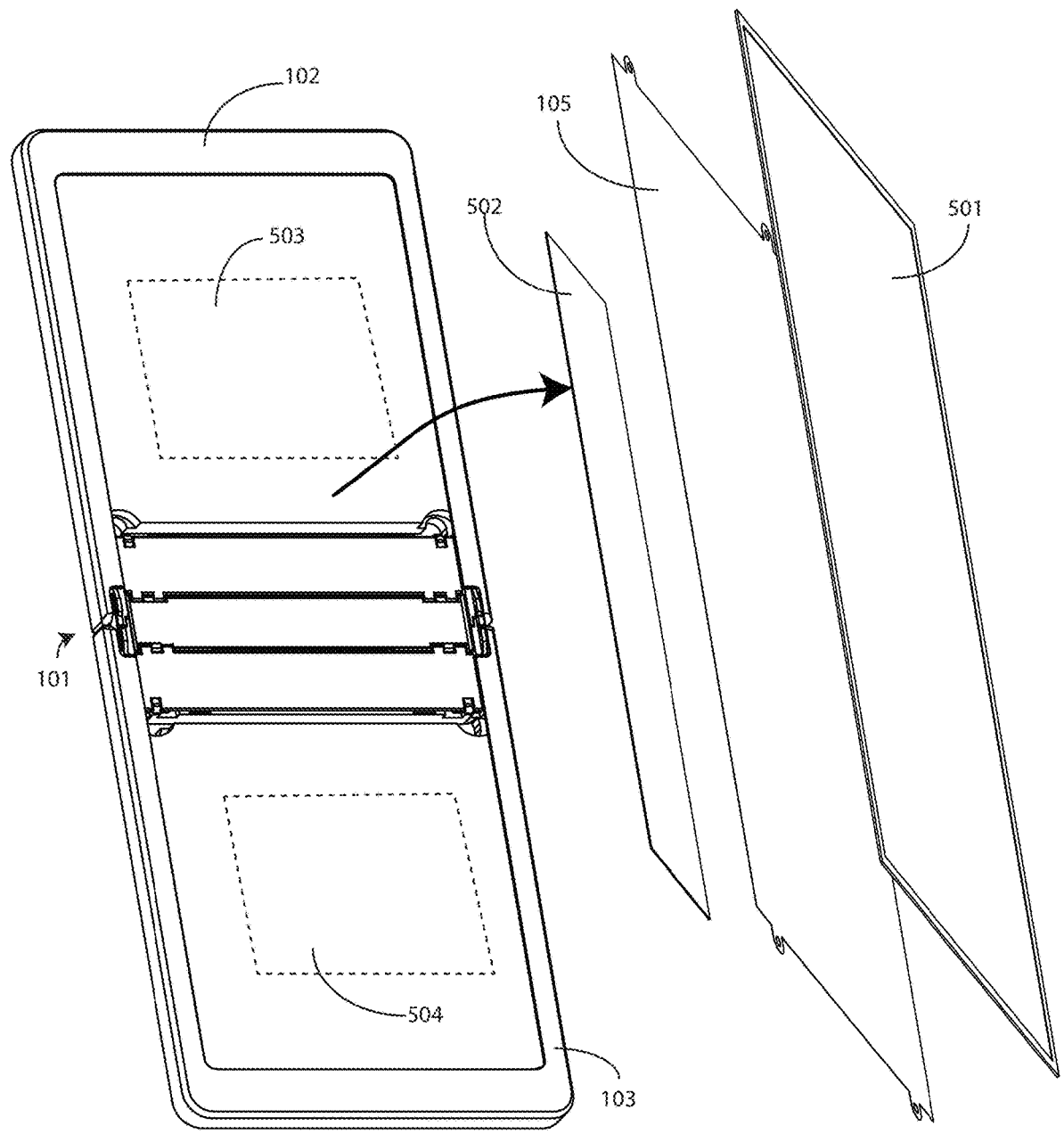
FIG. 5 illustrates an exploded view of one explanatory electronic device in accordance with one or more embodiments of the disclosure in the axially displaced open position.

Turning now to FIG. 5, illustrated therein is an exploded view of the electronic device 100. This view of the electronic device 100 allows various components of the first device housing 102, the second device housing 103, and the hinge 101 to be more clearly seen due to the fact that the display 105 and other components have been detached from the first device housing 102 and the second device housing 103 and shown in an exploded format.

As shown in FIG. 5, the display 105 is situated beneath a flexible fascia 501, which serves as a protective layer for the display 105. The display 105 and the flexible fascia 501 can be coupled to the first device housing 102 and the second device housing 103 so as to span the hinge 101. This allows the display 105 and flexible fascia 501 to deform when the first device housing 102 pivots about the hinge 101 relative to the second device housing 103.

Also shown in FIG. 5 is the flexible substrate 502. In one or more embodiments, the flexible substrate 502 provides a reliable electrical link through the hinge 101 between a first electronic circuit 503 disposed in the first device housing 102 and a second electronic circuit 504 disposed in the second device housing 103. In one or more embodiments, the flexible substrate 502 spans the hinge to couple the first electronic circuit 503 to the second electronic circuit 504.

Figure 6:
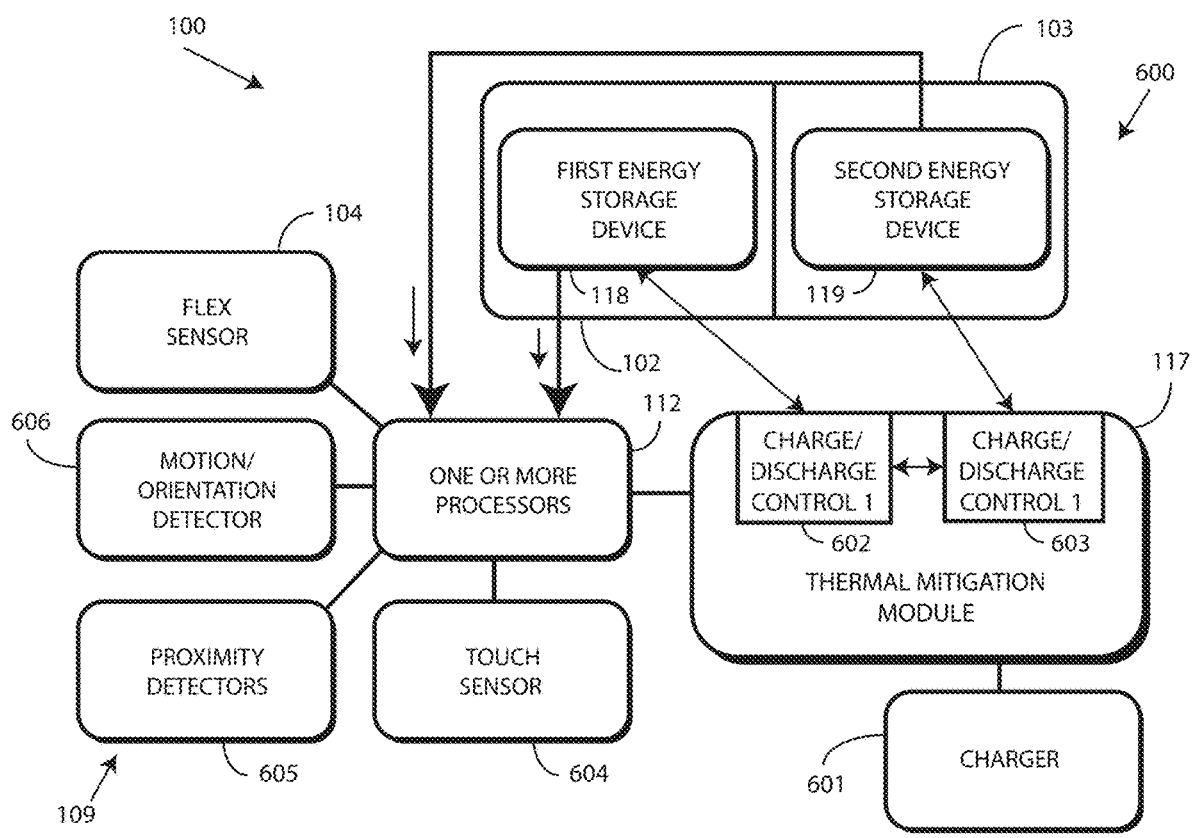
FIG. 6 illustrates one explanatory circuit in accordance with one or more embodiments of the disclosure.

Turning now to FIG. 6, illustrated therein is a schematic diagram 600 illustrating further details of one example of the electronic device 100 of FIG. 1. As shown, the electronic device 100 includes a first device housing 102 and a second device housing 103. A first energy storage device 118 is situated in the first device housing 102, while a second energy storage device 119 is situated in the second device housing 103.

In one or more embodiments, the thermal mitigation circuit 117 is operable with the first energy storage device 118 and the second energy storage device 119. In one or more embodiments, the thermal mitigation circuit 117 comprises charge and discharge control 602 responsible for charging, discharging, and measuring the charge states of, the first energy storage device 118. Similarly, another charge and discharge control 603 is responsible for charging, discharging, and measuring the charge states of, the second energy storage device 119. In one or more embodiments, the charge and discharge control 602 and the other charge and discharge control 603 can communicate with each other to optimize load balancing of the first energy storage device 118 and second energy storage device 119, thermal mitigation in the first device housing 102 and second device housing 103, and other conditions.

When a charger 601 is coupled to the thermal mitigation circuit 117, the charge and discharge control 602 and the other charge and discharge control 603 can charge the first energy storage device 118 and second energy storage device 119, respectively. The charge and discharge control 602 and the other charge and discharge control 603 can also power the one or more processors 112 and other components of the electronic device 100.

One or more sensors 109 of the electronic device 100 are shown in FIG. 6. In this illustration, the one or more sensors 109 comprise a flex sensor 104 configured to determine whether the electronic device 100 is in the axially displaced open position, the closed position, or somewhere in between. The one or more sensors 109 also include a touch sensor 604 to determine whether a user is holding, or predominantly holding, the electronic device 100 by the first device housing 102 or the second device housing 103. The one or more sensors 109 also include a motion/orientation detector 606 to determine whether the electronic device 100 is moving and its geometric orientation in three-dimensional space, such as whether the electronic device 100 is in a portrait orientation or a landscape orientation. The one or more sensors 109 also comprise one or more proximity sensors 605 that can detect objects approaching, or proximately located with, the first device housing 102 and/or the second device housing 103. The charge and discharge control 602 and the other charge and discharge control 603 can measure the energy storage level of the first energy storage device 118 and second energy storage device 119 as noted above.

It should be noted that the one or more sensors 109 shown in FIG. 6 are not comprehensive, as others will be obvious to those of ordinary skill in the art having the benefit of this disclosure. Additionally, it should be noted that the one or more sensors 109 shown in FIG. 6 could be used alone or in combination. Accordingly, many electronic devices will employ only subsets of the one or more sensors 109 shown in FIG. 6, with the particular subset chosen being defined by device application.

The touch sensor 604 can include a capacitive touch sensor, an infrared touch sensor, resistive touch sensors, or another touch-sensitive technology. Capacitive touch-sensitive devices include a plurality of capacitive sensors, e.g., electrodes, which are disposed along a substrate. Each capacitive sensor is configured, in conjunction with associated control circuitry, e.g., the one or more processors 112, to detect an object in close proximity with—or touching—the surface of the display or the housing of an electronic device by establishing electric field lines between pairs of capacitive sensors and then detecting perturbations of those field lines.

The electric field lines can be established in accordance with a periodic waveform, such as a square wave, sine wave, triangle wave, or other periodic waveform that is emitted by one sensor and detected by another. The capacitive sensors can be formed, for example, by disposing indium tin oxide patterned as electrodes on the substrate. Indium tin oxide is useful for such systems because it is transparent and conductive. Further, it is capable of being deposited in thin layers by way of a printing process. The capacitive sensors may also be deposited on the substrate by electron beam evaporation, physical vapor deposition, or other various sputter deposition techniques.

The motion/orientation detector 606 can include an accelerometer, gyroscopes, or other devices that sense motion or geometric orientation of the electronic device 100 in three-dimensional space. Using an accelerometer as an example, an accelerometer can be included to detect motion of the electronic device. Additionally, the accelerometer can be used to sense some of the gestures of the user, such as one talking with their hands, running, or walking.

The motion/orientation detector 606 can also be used to determine the spatial orientation of an electronic device as well in three-dimensional space by detecting a gravitational direction. In addition to, or instead of, an accelerometer, an electronic compass can be included to detect the spatial orientation of the electronic device relative to the earth's magnetic field. Similarly, one or more gyroscopes can be included to detect rotational motion of the electronic device.

The proximity sensors 605 fall in to one of two camps: active proximity sensors and "passive" proximity sensors. These are referred to as proximity detector components and proximity sensor components. Either the proximity detector components or the proximity sensor components can be generally used for gesture control and other user interface protocols., some examples of which will be described in more detail below.

As used herein, a "proximity sensor component" comprises a signal receiver only that does not include a corresponding transmitter to emit signals for reflection off an object to the signal receiver. A signal receiver only can be used due to the fact that a user's body or other heat generating object external to device, such as a wearable electronic device worn by user, serves as the transmitter. Illustrating by example, in one the proximity sensor components comprise a signal receiver to receive signals from objects external to the housing of an electronic device. In one embodiment, the signal receiver is an infrared signal receiver to receive an infrared emission from an object such as a human being when the human is proximately located with the electronic device. In one or more embodiments, the proximity sensor component is configured to receive infrared wavelengths of about four to about ten micrometers. This wavelength range is advantageous in one or more embodiments in that it corresponds to the wavelength of heat emitted by the body of a human being.

Additionally, detection of wavelengths in this range is possible from farther distances than, for example, would be the detection of reflected signals from the transmitter of a proximity detector component. In one embodiment, the proximity sensor components have a relatively long detection range so as to detect heat emanating from a person's body when that person is within a predefined thermal reception radius. For example, the proximity sensor component may be able to detect a person's body heat from a distance of about ten feet in one or more embodiments. The ten-foot dimension can be extended as a function of designed optics, sensor active area, gain, lensing gain, and so forth.

Proximity sensor components are sometimes referred to as a "passive IR system" due to the fact that the person is the active transmitter. Accordingly, the proximity sensor component requires no transmitter since objects disposed external to the housing deliver emissions that are received by the infrared receiver. As no transmitter is required, each proximity sensor component can operate at a very low power level.

In one embodiment, the signal receiver of each proximity sensor component can operate at various sensitivity levels so as to cause the at least one proximity sensor component to be operable to receive the infrared emissions from different distances. For example, the one or more processors 112 can cause each proximity sensor component to operate at a first "effective" sensitivity so as to receive infrared emissions from a first distance. Similarly, the one or more processors 112 can cause each proximity sensor component to operate at a second sensitivity, which is less than the first sensitivity, so as to receive infrared emissions from a second distance, which is less than the first distance. The sensitivity change can be made by causing the one or more processors 112 to interpret readings from the proximity sensor component differently.

By contrast, proximity detector components include a signal emitter and a corresponding signal receiver. While each proximity detector component can be any one of various types of proximity sensors, such as but not limited to, capacitive, magnetic, inductive, optical/photoelectric, imager, laser, acoustic/sonic, radar-based, Doppler-based, thermal, and radiation-based proximity sensors, in one or more embodiments the proximity detector components comprise infrared transmitters and receivers. The infrared transmitters are configured, in one embodiment, to transmit infrared signals having wavelengths of about 860 nanometers, which is one to two orders of magnitude shorter than the wavelengths received by the proximity sensor components. The proximity detector components can have signal receivers that receive similar wavelengths, i.e., about 860 nanometers.

In one or more embodiments, each proximity detector component can be an infrared proximity sensor set that uses a signal emitter that transmits a beam of infrared light that reflects from a nearby object and is received by a corresponding signal receiver. Proximity detector components can be used, for example, to compute the distance to any nearby object from characteristics associated with the reflected signals. The reflected signals are detected by the corresponding signal receiver, which may be an infrared photodiode used to detect reflected light emitting diode (LED) light, respond to modulated infrared signals, and/or perform triangulation of received infrared signals.

While the one or more sensors 109 shown in FIG. 6 work well to determine whether a user is holding the electronic device 100 by the first device housing 102 or the second device housing 103, other devices, one example of which is the image capture device (106) of FIG. 1, can be used as well. The image capture device (106) can be configured to capture an image of an object and determine whether the object matches predetermined criteria. For example, the image capture device (106) can operate as an identification module configured with optical recognition such as include image recognition, character recognition, visual recognition, facial recognition, color recognition, shape recognition and the like. Advantageously, the image capture device (106) can be used as a facial recognition device to determine the identity of one or more persons detected about an electronic device.

For example, in one embodiment when the one or more proximity sensor components detect a person, the image capture device (106) can capture a photograph of that person. The image capture device (106) can then compare the image to a reference file stored in memory (113), to confirm beyond a threshold authenticity probability that the person's face sufficiently matches the reference file. Beneficially, optical recognition allows the one or more processors 112 to execute control operations only when one of the persons detected about the electronic device are sufficiently identified as the owner of the electronic device.

In addition to capturing photographs, the image capture device (106) can function in other ways as well. For example, in some embodiments the image capture device (106) can capture multiple successive pictures to capture more information that can be used to determine when the electronic device 100 is being supported by a surface. Alternatively, the image capture device (106) can capture or video frames, with or without accompanying metadata such as motion vectors.

In one or more embodiments, the thermal mitigation circuit 117 determines whether to draw more current from the first energy storage device 118 situated in the first device housing 102 or the second energy storage device 119 situated in the second device housing 103. In one or more embodiments, the thermal mitigation circuit 117 makes the selection as a function of (1) a support condition of the electronic device 100, (2) a geometric configuration of the electronic device 100, and (3) whether one or both of the first energy storage device 118 and second energy storage device 119 is charged above a minimum energy storage device charge threshold.

Illustrating by example, the flex sensor 104 can determine the geometry of the electronic device 100, while the motion/orientation detector 606 determines an orientation of the electronic device 100 in three-dimensional space. Similarly, the proximity sensors 605 and/or touch sensor 604 can determine whether the electronic device 100 is being held by, or held predominantly by, the first device housing 102 or the second device housing 103. Finally, the charge and discharge control 602 and the other charge and discharge control 603 can determine whether one or both of the first energy storage device 118 and/or second energy storage device 119 has an energy storage level that is above its minimum energy storage device charge threshold. Thus, the one or more sensors 109 may determine a support condition that involves the electronic device 100 being held while the geometric configuration comprises the electronic device 100 being in the axially displaced open position.

In one or more embodiments, the support condition comprises the electronic device 100 being held by, or held predominantly by, the first device housing 102. In one or more embodiments, this results in the thermal mitigation circuit 117 drawing more current from the second energy storage device 119 provided the second energy storage device is sufficiently charged. Otherwise, a prompt can be presented so the first energy storage device 118 can be used to power the electronic device 100 without warming the user's hand.

By contrast, when the support condition comprises the electronic device 100 being held by, or held predominantly by, the second device housing 103, the thermal mitigation circuit 117 will draw more current from the first energy storage device 118 provided the first energy storage device 118 is sufficiently charged. Otherwise, a prompt can be presented so the second energy storage device 119 can be used to power the electronic device 100 without warming the user's hand.

Where the support condition comprises the electronic device 100 being held, and the geometric configuration comprises the electronic device 100 being in the closed position, in one or more embodiments the thermal mitigation circuit 117 draws more current from the second energy storage device 119 since it is likely that the first device housing 102 is situated against the hand of the user. By contrast, when the support condition comprises the electronic device 100 being supported by a surface, and the geometric configuration comprises the electronic device 100 being in the axially displaced open position, in one or more embodiments the thermal mitigation circuit 117 draws more current from the first energy storage device 118 because the first energy storage device 118 frequently has a higher energy storage capacity.

When the charger 601 is connected, charging operations can occur in a similar manner. Illustrating by example, in one or more embodiments the thermal mitigation circuit 117, using the charge and discharge control 602 and other charge and discharge control 603, determine whether to charge the first energy storage device 118 situated in the first device housing 102 or the second energy storage device 119 situated in the second device housing 103 as a function of (1) the support condition of the electronic device 100 detected by the one or more sensors 109, (2) the geometric configuration of the electronic device 100, also detected by the one or more sensors 109, and (3) the energy storage level of the first energy storage device 118 and second energy storage device 119. For instance, when the support condition comprises the electronic device 100 being supported by a surface and the geometric configuration comprises the electronic device 100 being in a partially open position similar to that shown above in FIG. 3, the thermal mitigation circuit 117 may deliver more current from the first energy storage device 118 due to its larger size, and so forth.

Figure 7:
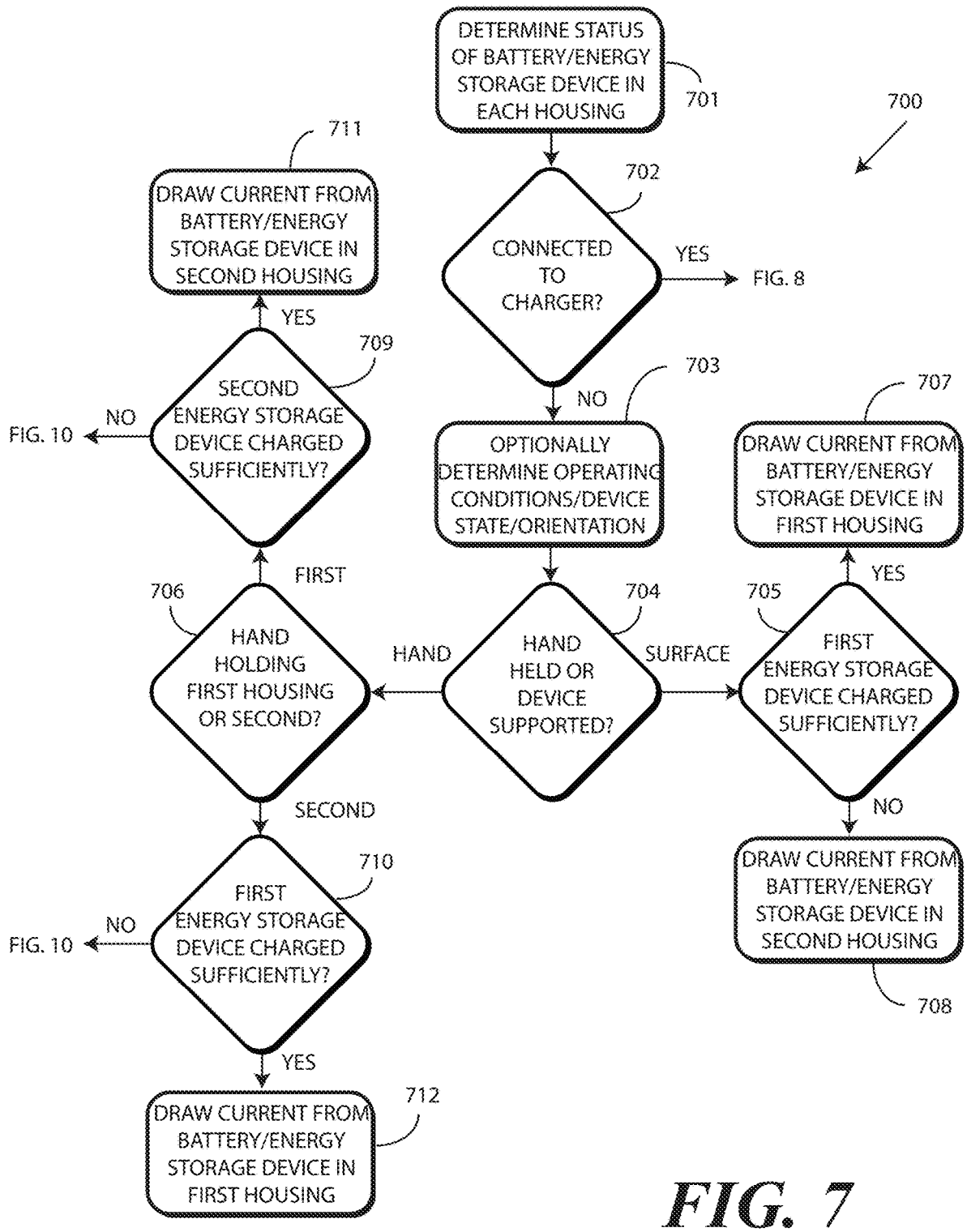
FIG. 7 illustrates one explanatory method in accordance with one or more embodiments of the disclosure.
Figure 8:
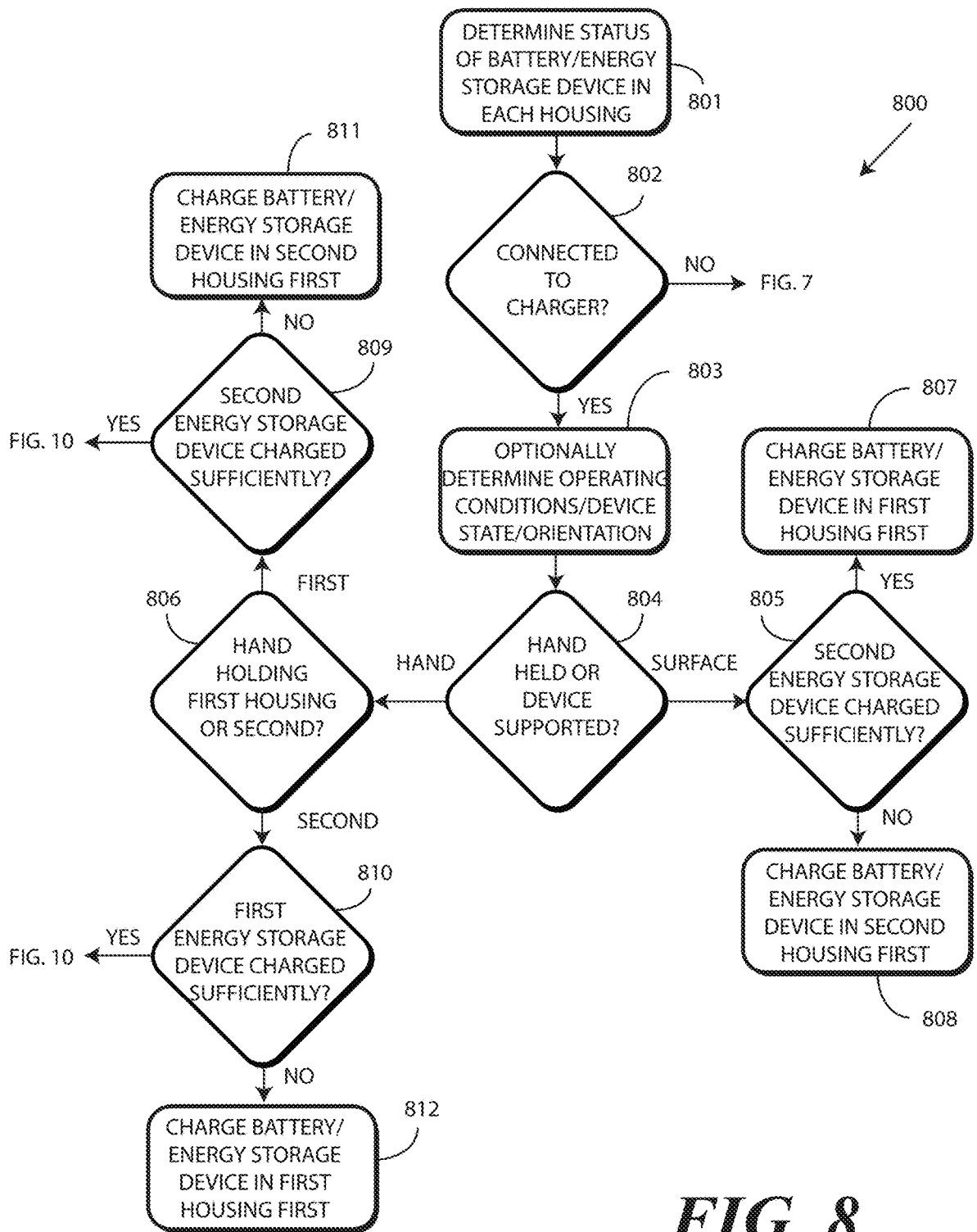
FIG. 8 illustrates another explanatory method in accordance with one or more embodiments of the disclosure.

Turning now to FIGS. 7 and 8, illustrated therein are general methods 700,800 for discharging and charging energy storage devices in an electronic device having multiple energy storage devices in accordance with embodiments of the disclosure, respectively. The method 700 of FIG. 7 is directed to determining from which energy storage device to draw current to power components of an electronic device, and alternatively when to present a prompt. The method 800 of FIG. 8 is directed to determining to which energy storage device to deliver charging current when a charger, such as that shown above with reference to FIG. 6, is connected to the electronic device and, optionally, when to present a prompt. In one or more embodiments, the methods 700,800 are directed to electronic devices having a first device housing that is pivotally coupled to a second device housing by a hinge such that the first device housing and second device housing can pivot between an axially displaced open position and a closed position.

Beginning with FIG. 7, at step 701 one or more processors or a thermal mitigation circuit of an electronic device determine the amount of energy stored in the energy storage device situated in the first device housing and the second device housing. If a single energy storage device is situated in the first device housing and another energy storage device is situated in the second device housing, step 701 can comprise determining how much energy is stored in each energy storage device.

Figure 9:
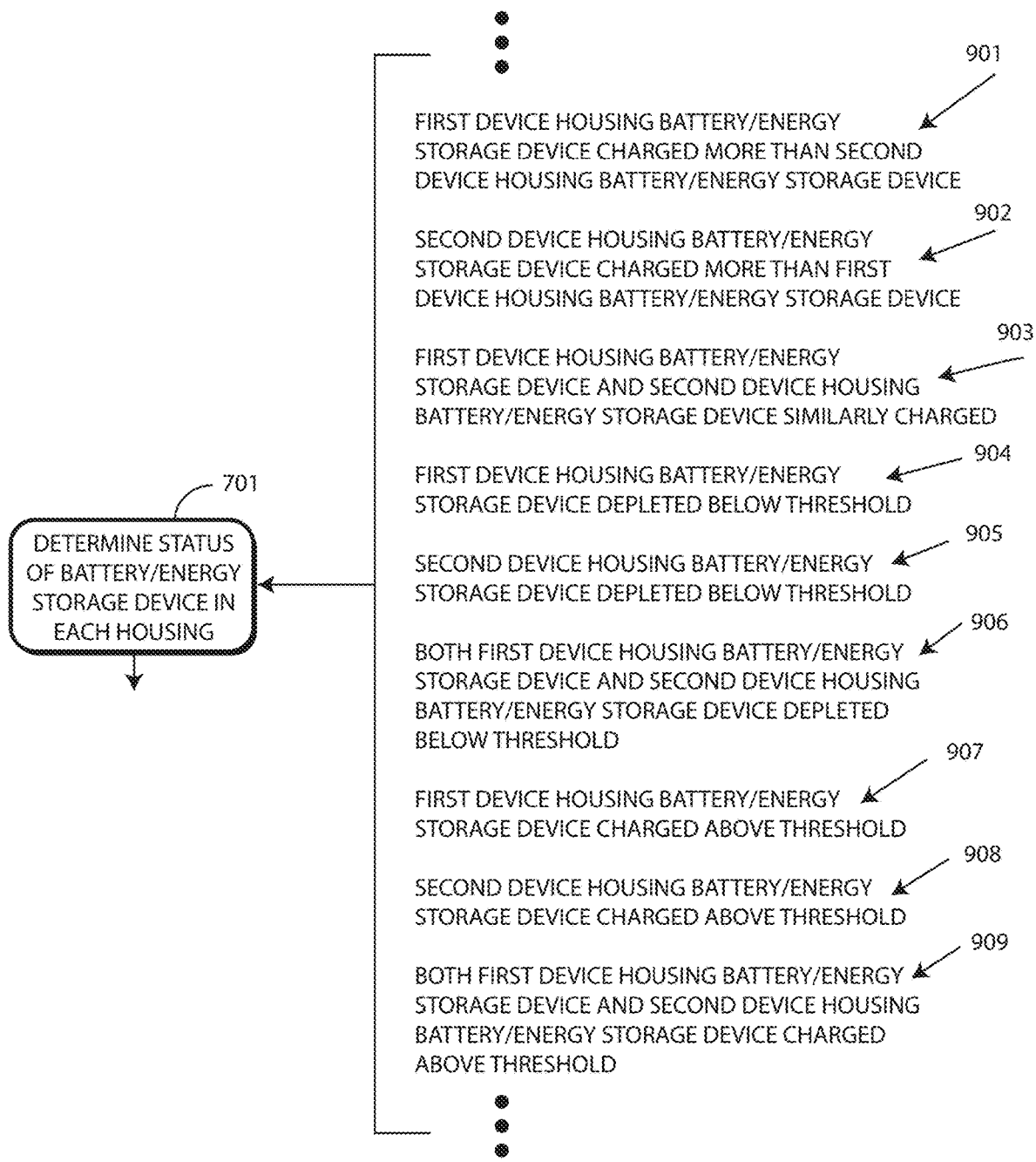
FIG. 9 illustrates one or more method steps in accordance with one or more embodiments of the disclosure.

This determination is made in one or more embodiments because if conditions are not sufficiently acceptable, the primary mode of operation where current is drawn from an energy storage device situated in a device housing that is not being held cannot occur unless a prompt is presented, and the support condition of the electronic device is changed. Turning now briefly to FIG. 9, illustrated therein are some of the conditions that can be identified by step 701.

One condition 901 that could be encountered is that the first energy storage device is charged more than the second energy storage device. When this difference is within a predefined threshold, drawing current from an energy storage device situated in a device housing not being held works well. However, when the difference exceeds the threshold, to prevent the disparity between energy storage devices from becoming too large, it can be advantageous to present a prompt so that, at least momentarily (until the disparity falls within the threshold at a minimum), current can be drawn from the energy storage device situated in the device housing that was initially being held but that would no longer be held if the user follows the instructions of the prompt.

When charging, while it is desirable to charge the energy storage device in the device housing not being held. However, if the difference between energy storage levels in the energy storage devices is outside the threshold it can be advantageous to at least momentarily charge the energy storage device in the device housing initially being held, at least until the disparity falls within the threshold. Accordingly, a prompt can be presented asking the user to hold the other device housing before this occurs.

Another condition 902 that can arise is that the second energy storage device is charged more than the first energy storage device. When this difference is within a predefined threshold, drawing current from an energy storage device situated in a device housing not being held works well. However, when the difference exceeds the threshold, to prevent the disparity between energy storage devices from becoming too large, a prompt can be presented asking the user to hold the other device housing. This allows current to be drawn from the energy storage device in the device housing initially being held, at least momentarily (until the disparity falls within the threshold at a minimum), without the user having to "feel the heat," as they say in the film noir gangster movies.

When charging, while it is desirable to charge the energy storage device in the device housing not being held. Accordingly, if the difference between energy storage levels in the energy storage devices is outside the threshold it can be advantageous to present a prompt instructing a change in the support condition so, at least momentarily, charging of the energy storage device in the device housing initially—but no longer in response to the prompt-being held can occur, at least until the disparity falls within the threshold.

Another condition 903 that can be encountered is that the energy storage devices are similarly charged. In such a condition, discharging or charging the energy storage device in the device housing not being held by, or held predominantly by, a hand works well, and no prompt is required.

Another condition 904 that can be encountered is that the first energy storage device is depleted below a minimum energy storage level threshold. When this occurs while the electronic device is being held by the first device housing in which the first energy storage device is situated, the first energy storage device should be charged first to ensure that reliability of the energy storage device is not compromised. Accordingly, a prompt can be presented asking the user to hold the other device housing first. Similarly, when held by the second device housing, current powering the electronic device should be drawn from the second energy storage device even though this will heat the second device housing. As such, a prompt can be presented first asking the user to "grab the first device housing before things get toasty."

Another condition 905 that can be encountered is that the second energy storage device is depleted below a minimum energy storage level threshold. When this occurs, even if the electronic device is being held by the second device housing in which the second energy storage device is situated, the second energy storage device should be charged first to ensure that reliability of the energy storage device is not compromised. Accordingly, a prompt can be presented asking the user to hold the other device housing first. When held by the first device housing, current powering the electronic device should be drawn from the first energy storage device even though this will heat the second device housing. As such, a prompt can be presented first asking the user to "Hey! Better grab that other device housing before charging starts spicing up this one with a touch of the heat."

In another condition 906, both the first energy storage device and the second energy storage device may be depleted to, or below, a minimum energy storage level threshold. When this occurs, the device is basically "dead." Current cannot be drawn from either energy storage device because reliability may be compromised. Generally, charging current will be delivered to both energy storage devices evenly until the energy storage levels rise above the minimum energy storage level threshold. A prompt may be presented saying, "the device is dead-since you can't use it until its charged, you may want to put it on a surface before the coals hit the fire."

Another condition 907 that can occur is that the first energy storage device is fully charged, or at least charged above a predefined energy storage level threshold. This condition 907 is when the system works best provided the electronic device is being held by the second device housing. If being held by the first device housing, a prompt can be presented saying, "Pardon me, I really need to charge the energy storage device in the device housing you're holding. That warms things a bit, so would you be so kind as to grab the other device housing instead?"

Another condition 908 that can occur is that the second energy storage device is fully charged, or at least charged above a predefined energy storage level threshold. This condition 908 is when the system works best provided the electronic device is being held by the first device housing. If being held by the second device housing, a prompt may be presented saying, "Hey, old bean, apologize for the intrusion, but the device needs to warm what you're holding by delivering a bit of charge current to an energy storage device. Be a pal and grab the other side, would you?"

Yet another condition 909 that can occur is the preferred condition, and that is where both the first energy storage device and the second energy storage device are charged above a predefined threshold. When this occurs, charging current can be delivered to the energy storage device situated in the device housing not being held until a maximum charge is reached. Thereafter it can be delivered to the energy storage device situated in the device housing being held. Discharge current can similarly be drawn from the energy storage device situated in the device housing not being held, at least until a minimum energy storage level is reached. Thereafter, current will need to be drawn from the energy storage device situated in the device housing being held, and so forth. Nary a prompt at all is required when this condition 909 exists. Turning now back to FIG. 7, decision 702 then determines whether the electronic device is coupled to a charger. Where it is, the method 700 proceeds to FIG. 8. Otherwise, the method 700 proceeds to step 703.

At step 703, one or more sensors of the electronic device optionally determine what conditions the electronic device is experiencing. These conditions can include whether the electronic device is moving or stationary, an orientation of the electronic device in three-dimensional space, e.g., whether it is oriented in a portrait orientation or landscape orientation, how the electronic device is being supported, e.g., by a hand or surface, and the geometric configuration of the electronic device, e.g., whether the electronic device is in the axially displaced open position, the closed position, or positions therebetween.

Decision 704 determines whether the electronic device is being supported by a hand or a surface. Techniques for doing this were described above with reference to FIGS. 1 and 6. Other such techniques will be obvious to those of ordinary skill in the art having the benefit of this disclosure.

Where the electronic device is being supported by a hand, the method 700 moves to decision 706. At decision 706, the method 700 determines whether the electronic device is being held by, or held predominantly by, the first device housing or the second device housing.

Where the electronic device is being held by, or held predominantly by, the first device housing, the method 700 moves to decision 709 where one or more sensors of the electronic device determine whether the second energy storage device situated in the second device housing is sufficiently charged, i.e., is charged beyond a minimum second energy storage device charge threshold. Decision 709 is similar to decision 710, with the difference being decision 710 determining whether the first energy storage device situated in the first device housing is sufficiently charged, i.e., is charged beyond a minimum first energy storage device charge threshold.

If decision 709 determines that the second energy storage device situated in the second device housing is charged beyond a minimum second energy storage device charge threshold, the method 700 moves to step 711 where current required to power the electronic device is drawn from, or predominantly from, the second energy storage device situated in the second device housing when the user is holding the first device housing. Otherwise, the method 700 moves to FIG. 10.

Similarly, if decision 710 determines that the first energy storage device situated in the first device housing is charged beyond a minimum first energy storage device charge threshold, the method 700 moves to step 712 where current required to power the electronic device is drawn from, or predominantly from, the first energy storage device situated in the first device housing when the user is holding the second device housing. Otherwise, the method 700 again moves to FIG. 10.

When the electronic device is being supported by a surface, decision 705 determines whether the first energy storage device situated in the first device housing is charged beyond a minimum first energy storage device charge threshold. Where it is, and when the electronic device is supported by a surface, step 707 comprises powering the electronic device from the first energy storage device situated in the first device housing. However, where the first energy storage device is not sufficiently charged for this mode of operation, current is drawn from the second energy storage device situated in the second device housing at step 708.

Turning now to the method 800 of FIG. 8, the selection of which of the first energy storage device or second energy storage device to charge at a given point in time is illustrated. Beginning with step 801, at this step 801 one or more processors or a thermal mitigation circuit of an electronic device determine the amount of energy stored in the energy storage device situated in the first device housing and the second device housing. Scenarios that can occur at this step 801, as well as their implications, were described above with reference to FIG. 9 and are incorporated here by reference. In one or more embodiments, when a single energy storage device is situated in the first device housing and another energy storage device is situated in the second device housing, step 801 comprises determining how much energy is stored in each energy storage device.

Decision 802 then determines whether the electronic device is coupled to a charger. Where it is, the method 800 proceeds to FIG. 7. Otherwise, the method 800 proceeds to step 803.

At step 803, one or more sensors of the electronic device optionally determine what conditions the electronic device is experiencing. These conditions can include whether the electronic device is moving or stationary, an orientation of the electronic device in three-dimensional space, e.g., whether it is oriented in a portrait orientation or landscape orientation, how the electronic device is being supported, e.g., by a hand or surface, and the geometric configuration of the electronic device, e.g., whether the electronic device is in the axially displaced open position, the closed position, or positions therebetween.

Decision 804 determines whether the electronic device is being supported by a hand or a surface. Techniques for doing this were described above with reference to FIGS. 1 and 6. Other such techniques will be obvious to those of ordinary skill in the art having the benefit of this disclosure.

Where the electronic device is being supported by a hand, the method 800 moves to decision 806. At decision 806, the method 800 determines whether the electronic device is being held by, or held predominantly by, the first device housing or the second device housing.

Where the electronic device is being held by, or held predominantly by, the first device housing, the method 800 moves to decision 809 where one or more sensors of the electronic device determine whether the second energy storage device situated in the second device housing is fully charged, i.e., is charged beyond an upper limit second energy storage device charge threshold. Decision 809 is similar to decision 810, with the difference being decision 810 determining whether the first energy storage device situated in the first device housing is sufficiently charged, i.e., is charged beyond an upper limit first energy storage device charge threshold.

If decision 809 determines that the second energy storage device situated in the second device housing is not charged beyond the upper limit second energy storage device charge threshold, the method 800 moves to step 811 where a charging current is delivered to, or predominantly to, the second energy storage device situated in the second device housing when the user is holding the first device housing. Otherwise, the method 800 moves to FIG. 10.

Similarly, if decision 810 determines that the first energy storage device situated in the first device housing is not charged beyond the upper limit first energy storage device charge threshold, the method 800 moves to step 812 where charging current is delivered to, or predominantly to, the first energy storage device situated in the first device housing when the user is holding the second device housing. Otherwise, the method 800 again moves to FIG. 10.

When the electronic device is being supported by a surface, decision 805 determines whether the second energy storage device situated in the second device housing is charged beyond the upper limit second energy storage device charge threshold. Where it is, charging current is delivered to, or predominantly to, the first energy storage device situated in the first device housing at step 807. Where it is not, charging current is delivered to, or predominantly to, the second energy storage device situated in the second device housing at step 808.

Figure 10:
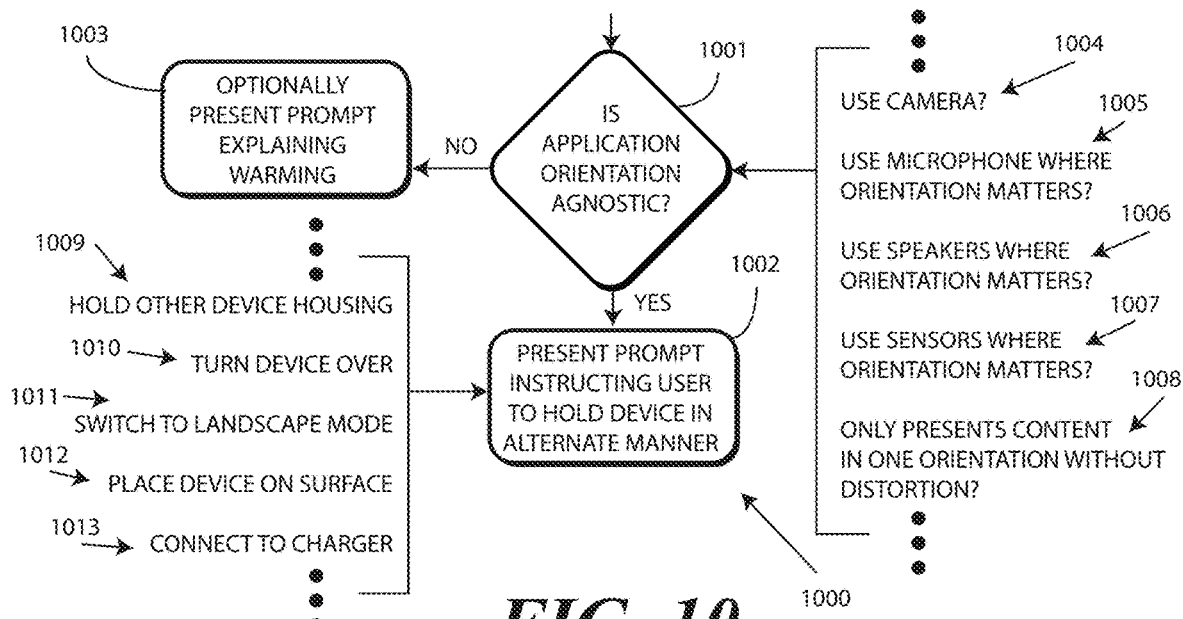
FIG. 10 illustrates one or more method steps in accordance with one or more embodiments of the disclosure.

Turning now to FIG. 10, illustrated therein are additional steps of a method 1000 that can be performed when the preferred mode of operation, i.e., drawing current from, or predominantly from, the energy storage device situated in the device housing not being held or, in a charging scenario, delivering current to, or predominantly to, the energy storage device situated in the device housing not being held. Beginning at decision 1001, the method 1000 determines whether an application operating in the foreground is orientation agnostic. As noted above, an application is considered orientation agnostic when one of a few conditions is true.

If the application can only present content in one orientation 1008 without distortion, this would certainly be an orientation sacrosanct application. If, for example, the application could present content in the landscape orientation, but had to crop or stretch the content when in the portrait orientation such that portions of the content were no longer available, this would be an orientation sacrosanct application.

If the application could present content in a variety of orientations, such as by rotating and scaling the content, the application might be an orientation agnostic application, but only when the operation of one or more of a camera 1004, microphone 1005, speaker 1006, or other sensors 1007 that are orientation dependent are not affected when orientation is changed or when the electronic device is supported differently in accordance with instructions from a prompt. For instance, if a first device housing supports a camera 1004 being used by a videoconferencing application, and a user is holding the electronic device by the second device housing, conceivably holding the electronic device by the first device housing will block the camera 1004 being from being successfully used by the videoconferencing application. Accordingly, even if the videoconferencing application is capable of presenting content either in the landscape orientation or portrait orientation, it would not be orientation agnostic because the camera 1004 it requires for operation would be occluded if the electronic device were being held by the device housing supporting the camera 1004.

A video streaming application capable of streaming a selected video both when the electronic device is in the portrait orientation or the landscape orientation would be orientation agnostic, provided that the speaker 1006 being used for audio accompanying the video were not occluded when the orientation was changed. By contrast, a gaming application that can only present content in the landscape orientation would not be orientation agnostic. It would instead be orientation sacrosanct since the content is only presented in one orientation. An application that had to cut, crop, stretch, or deform content when the electronic device changed orientations would also be orientation sacrosanct. An application that could only receive audio content from a microphone 1005 when in one geometric orientation would be orientation sacrosanct, and so forth.

Where the foreground application is orientation agnostic, as determined by decision 1001, step 1002 comprises presenting, delivering, or otherwise outputting a prompt instructing that the electronic device be supported differently so that current can be delivered to the energy storage device situated in the device housing being held before delivery of the prompt. Thus, while the method (700) of FIG. 7 provided for determining whether to draw more current from a first energy storage device situated in a first device housing pivotable about a hinge relative to the second device housing between an axially displaced open position and a closed position, or a second energy storage device situated in the second device housing as a function of a support condition of the electronic device detected by one or more sensors of the electronic device, as well as for selecting a selected energy storage device to draw more current from and detecting whether the selected energy storage device is charged beyond a selected energy storage device charge threshold, the method 1000 of FIG. 10 provides at step 1002 for the presentation or delivery of a prompt. The prompt can take a variety of forms.

In one or more embodiments, the prompt can instruct a user of the electronic device to hold another device housing 1009 of the electronic device. In other embodiments, the prompt can instruct the user to invert 1010 the electronic device. In still other embodiments, the prompt can instruct the user to change an orientation 1011 of the electronic device. Illustrating by example, the prompt may instruct the user to change a landscape orientation to portrait orientation or vice versal.

In still other embodiments, the prompt can instruct the user to place the electronic device on a surface 1012. In still other embodiments, the prompt can instruct the user to connect the electronic device to a charger 1013. These examples of prompts are illustrative only. Others will be obvious to those of ordinary skill in the art having the benefit of this disclosure.

For example, when the foreground application is determined at decision 1001 to be an orientation sacrosanct application, step 1003 can comprise presenting a prompt explaining heat generation within the electronic device. The prompt might say, "the device needs to use [or charge] the battery in the device house you're currently holding. Ordinarily, you would be asked to hold the other device housing. However, this would block the microphone [or speaker] [or sensors], so when charging begins you might experience the device housing you're holding getting a bit warmer. If you stop using this application and switch to another that doesn't use the microphone [or speaker] [or sensors], feel free to grab that other device housing because it's probably going to be a bit cooler," or something similar. Other examples of heat generation prompts will be obvious to those of ordinary skill in the art having the benefit of this disclosure.

Figure 12:
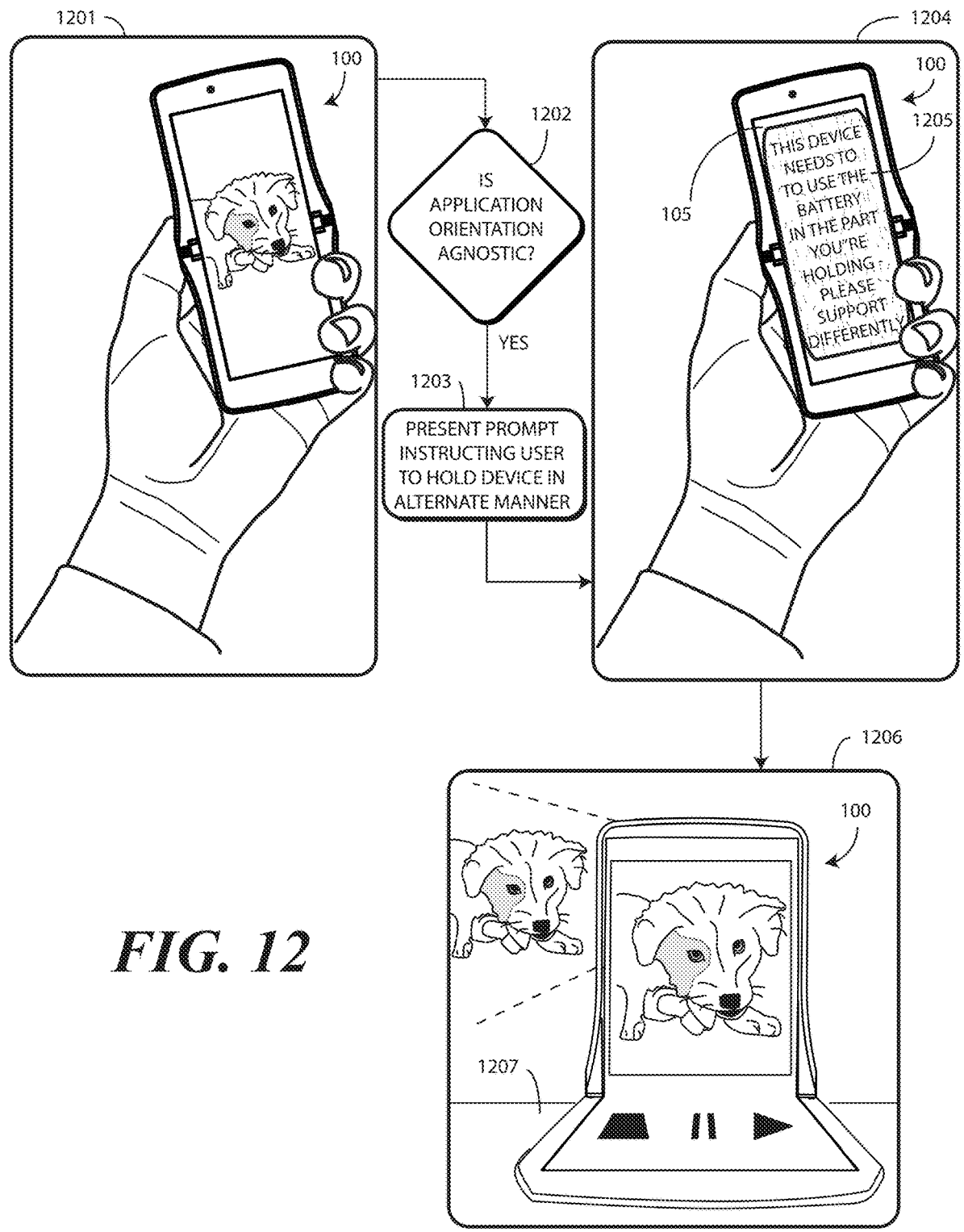
FIG. 12 illustrates one or more method steps in accordance with one or more embodiments of the disclosure.
Figure 13:
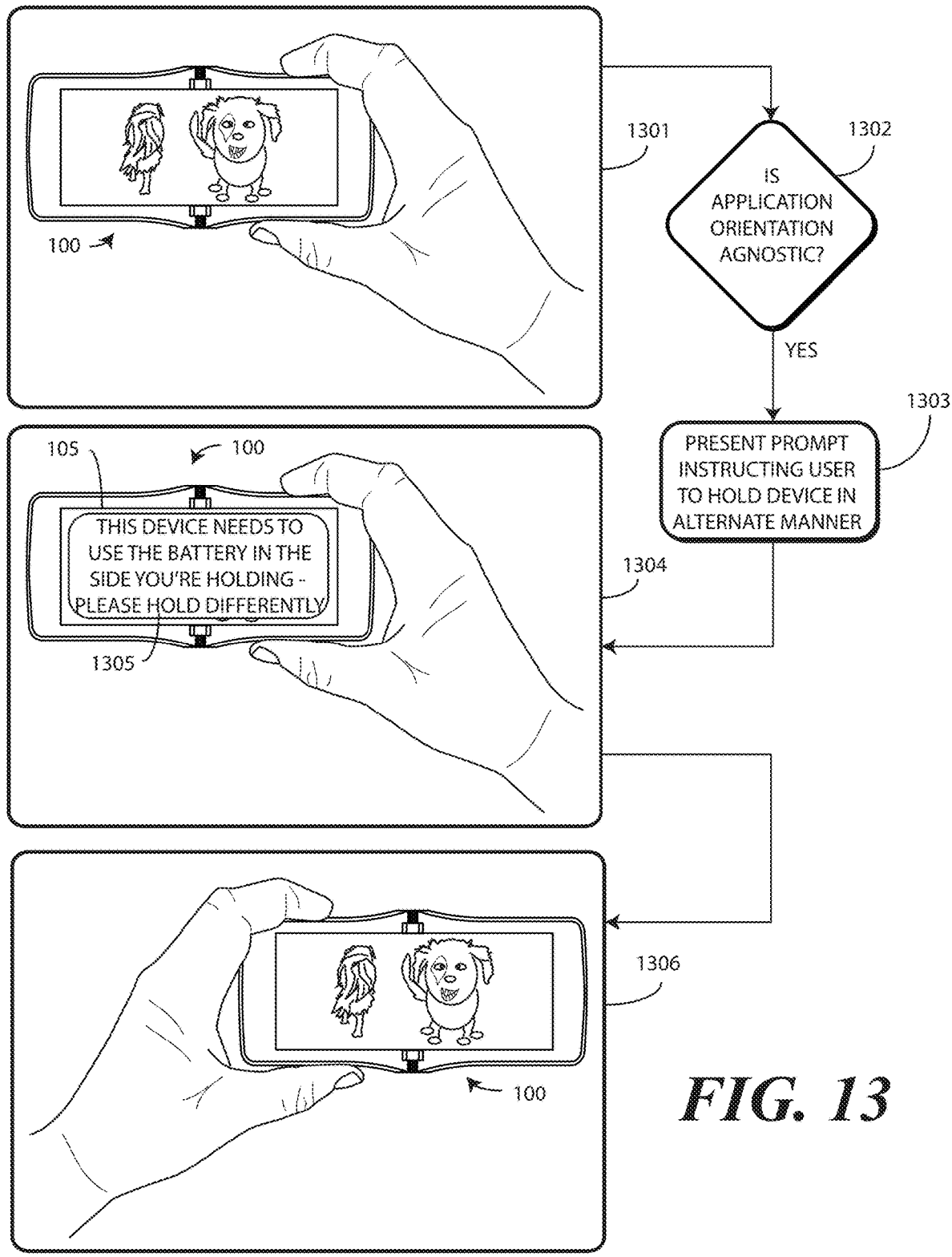
FIG. 13 illustrates one or more method steps in accordance with one or more embodiments of the disclosure.

Now that the general hardware, systems, and methods have been described, attention will be turned to some use cases occurring in accordance with one or more embodiments of the disclosure. The use cases describe below provide illustrations of operations of embodiments of the disclosure operating in situations where the preferred "charge or discharge the energy storage device in the device housing not being held" mode of operation cannot occur due to the charge state of that energy storage device. In such situations, a prompt is required. Accordingly, FIGS. 11-13 illustrate both use cases in which the preferred mode of operation occurs and other use cases where the preferred mode of operation is precluded by a special factor.

Figure 11:
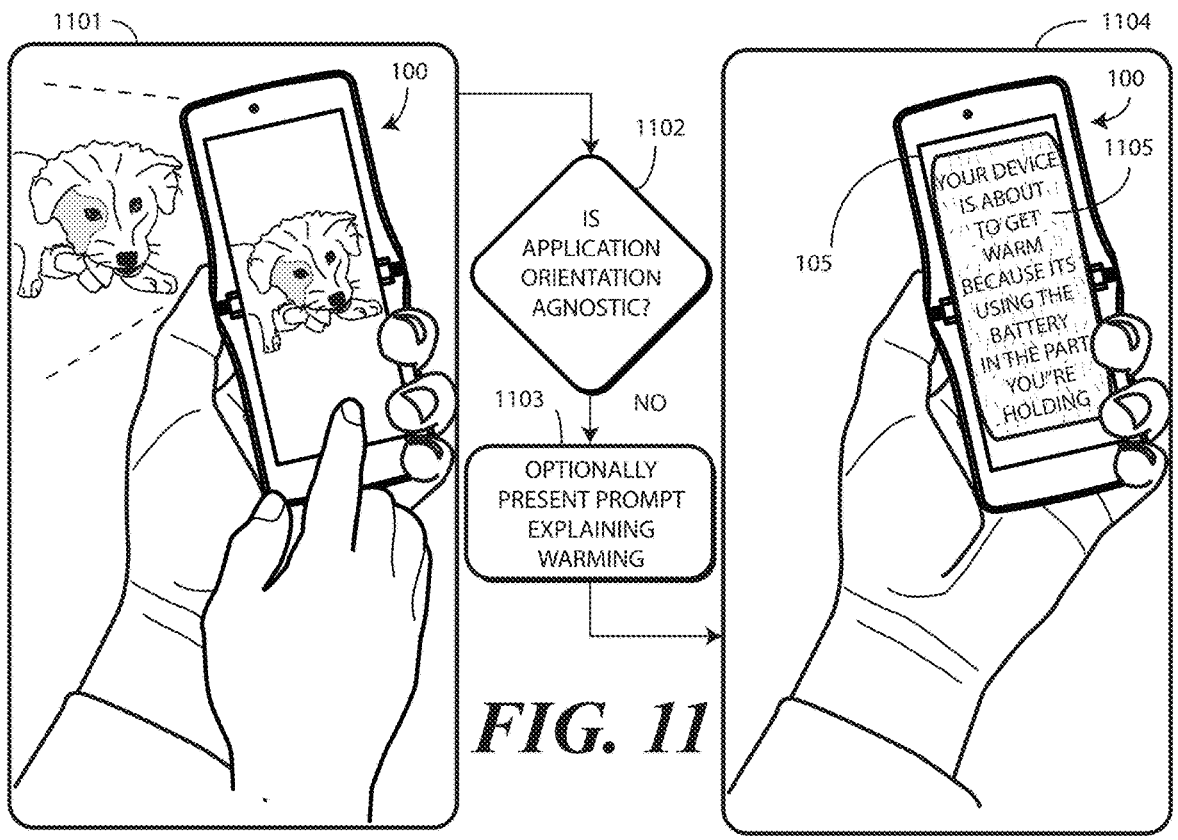
FIG. 11 illustrates one or more method steps in accordance with one or more embodiments of the disclosure.

Beginning with FIG. 11, illustrated therein is one such use case. As shown at step 1101, an electronic device 100 configured in accordance with one or more embodiments an electronic device 100 is in the axially displaced open position and is being supported by a hand as shown at step 1101. As also shown at step 1101, the user of the electronic device 100 is taking a picture of his dog, Buster. Accordingly, the foreground application is an image capture application availing itself of the image capture device (106) on the rear side of the second device housing.

Decision 1102 determines whether the image capture application is orientation agnostic. If the user wanted to keep the electronic device 100 in the portrait orientation and hold the electronic device 100 in the same manner, changing a support condition to hold the second device housing would require an inversion of the electronic device 100. However, if the user inverted the electronic device 100 and held it the same way as shown at step 1101, his hand would occlude the image capture device (106). Accordingly, in this situation the image capture application is not orientation agnostic.

At step 1103, one or more processors (112) of the electronic device 100 accordingly present a prompt 1105 on a display 105 of the electronic device 100 explaining heat generation in the electronic device 100. An example of this prompt 1105 is shown at step 1104. The prompt 1105 states, "your device is about to get warm because it's using the battery in the part you're holding." This prompt 1105 is only one example of a heat generation prompt. Others will be obvious to those of ordinary skill in the art having the benefit of this disclosure.

Turning now to FIG. 12, illustrated therein is another use case that is the corollary to the use case of FIG. 11. Once again, an electronic device 100 configured in accordance with one or more embodiments an electronic device 100 is in the axially displaced open position and is being supported by a hand as shown at step 1201. As also shown at step 1201, the user of the electronic device 100 is looking at the picture of his dog, Buster, which he took above in FIG. 11. Accordingly, the foreground application is an image viewing application. In contrast to the image capture application, the image viewing application does not avail itself of the image capture device (106) on the rear side of the second device housing. Moreover, it can present the picture of Buster regardless of whether the electronic device 100 is in the landscape orientation, portrait orientation, or some orientation in between.

Decision 1202 determines whether the image capture application is orientation agnostic. Here, the image viewing application is indeed orientation agnostic. No sensors are used, and content can be displayed when the electronic device is in any orientation.

At step 1203, one or more processors (112) of the electronic device 100 accordingly present a prompt 1205 on a display 105 of the electronic device 100. In contrast to the prompt (1105) of FIG. 11 explaining heat generation in the electronic device 100, the prompt 1205 of FIG. 12 instructs that the electronic device 100 be supported differently since the foreground application is orientation agnostic.

An example of this prompt 1205 is shown at step 1204. The prompt 1205 states, "this device needs to use the battery in the part you're holding-please support [the device] differently." This prompt 1105 is only one example of a heat generation prompt. Others will be obvious to those of ordinary skill in the art having the benefit of this disclosure. For example, rather than "please support differently," the prompt 1205 may have said "please hold the other end," "please hold the other device housing," "please turn the electronic device over," and so forth.

In this illustrative embodiment, the user got creative. Rather than selecting any of the options above, the user partially folded the electronic device 100 to the tent position and placed it on a surface 1207 as shown at step 1206. This not only allows the energy storage device situated in the first device housing to charge (since the surface 1207 does not care if it gets warm), but it also prepares the electronic device 100 for optimal performance since the larger battery (batteries in the first device housing are typically is larger since external displays, cameras, and other features reduce the space available for an energy storage device in the second device housing) is being charged. Accordingly, for a less clever user, rather than "please support differently," the prompt 1205 may have said "please put the device on a surface if one is available," and so forth.

Turning now to FIG. 13, illustrated therein is yet another use case for an electronic device configured in accordance with one or more embodiments of the disclosure. Once again, an electronic device 100 configured in accordance with one or more embodiments an electronic device 100 is in the axially displaced open position and is being supported by a hand as shown at step 1301. However, rather than being supported in the portrait orientation, as was the case in the use cases of FIGS. 11-12, in FIG. 13 the electronic device 100 is being supported by one device housing while in the landscape orientation.

As also shown at step 1301, the user of the electronic device 100 is looking at a video he stored in the cloud of the antics of Buster and his best friend, Mac. Accordingly, the foreground application is a video streaming application. In this use case, the video streaming application does not avail itself of any sensors. Moreover, it can stream and present the video of Buster and Mac regardless of whether the electronic device 100 is in the landscape orientation, portrait orientation, or some orientation in between.

Decision 1302 determines whether the video streaming application is orientation agnostic. Here, the video streaming application is orientation agnostic. No sensors are used, and video content can be displayed when the electronic device is in any orientation.

At step 1303, one or more processors (112) of the electronic device 100 accordingly present a prompt 1305 on a display 105 of the electronic device 100. The prompt 1305 of FIG. 13 instructs that the electronic device 100 be supported differently since the foreground application is orientation agnostic.

An example of this prompt 1305 is shown at step 1304. The prompt 1305 states, "this device needs to use the battery in the part you're holding-please hold differently." This prompt 1105 is only one example of a heat generation prompt. Others were discussed above. Still others will be obvious to those of ordinary skill in the art having the benefit of this disclosure.

In this illustrative embodiment, the user did not want to lose the submersive experience he receives with the wide-angle video that gets presented when the electronic device 100 is held in landscape orientation. Accordingly, he simply grabbed the other device housing instead, as shown at step 1306. This not only allows the energy storage device situated in the device housing he initially held to charge, but it also helps the user relive the antics of both Buster and Mac in high definition, non-scaled video. Accordingly, for a less clever user, rather than "please support differently," the prompt 1205 may have said "please grab the other side," and so forth.

Figure 14:
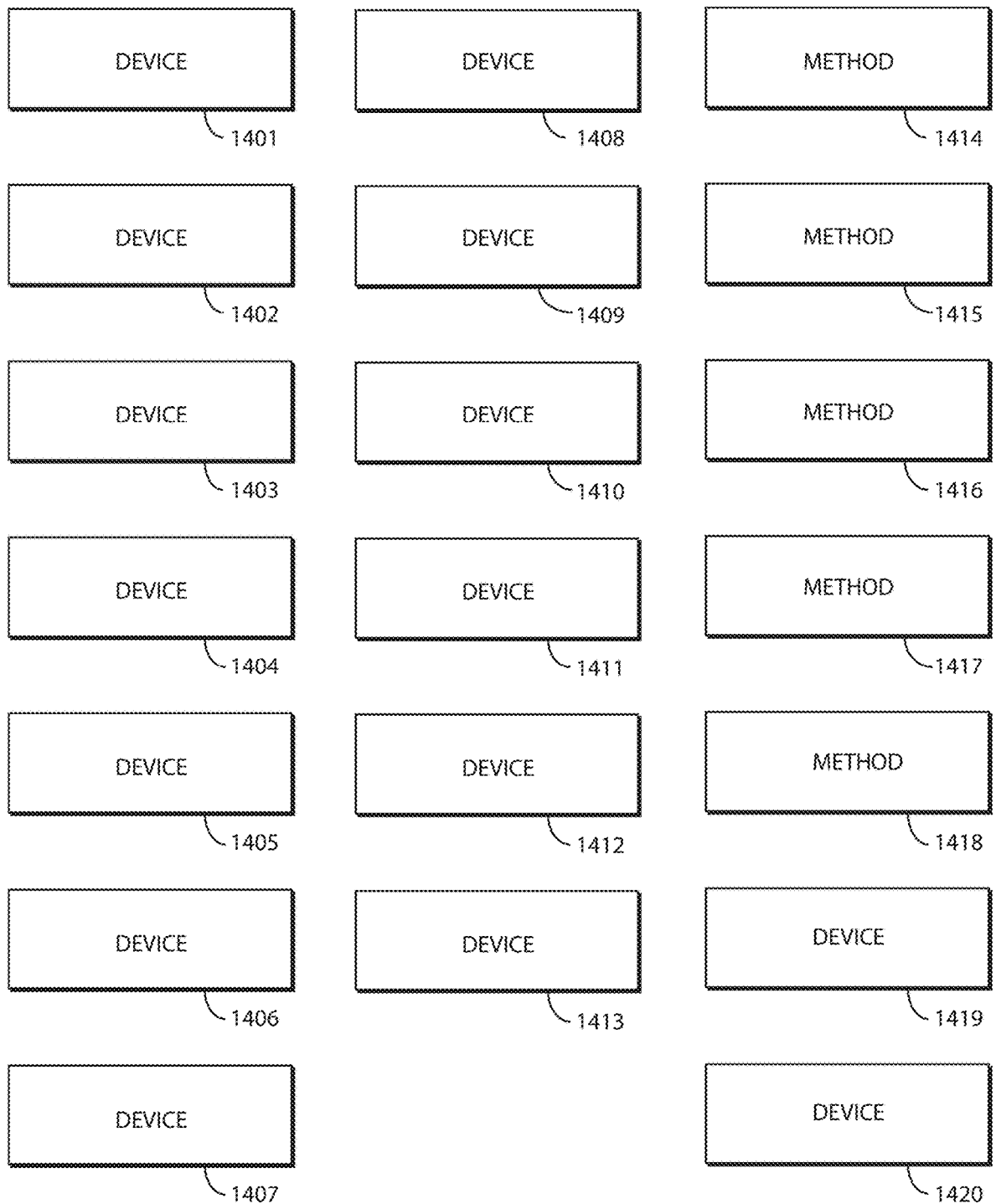
FIG. 14 illustrates one or more embodiments of the disclosure.

Turning now to FIG. 14, illustrated therein are various embodiments of the disclosure. The embodiments of FIG. 14 are shown as labeled boxes in FIG. 14 due to the fact that the individual components of these embodiments have been illustrated in detail in FIGS. 1-13, which precede FIG. 14. Accordingly, since these items have previously been illustrated and described, their repeated illustration is no longer essential for a proper understanding of these embodiments. Thus, the embodiments are shown as labeled boxes.

At 1401, an electronic device comprises a first device housing pivotable about a hinge relative to a second device housing between an axially displaced open position and a closed position. At 1401, the electronic device comprises one or more processors, a user interface operable with the one or more processors, and one or more sensors operable with the one or more processors.

At 1401, the electronic device comprises a first energy storage device situated in the first device housing and operable to power the one or more processors. At 1401, the electronic device comprises a second energy storage device situated in the second device housing and also operable to power the one or more processors.

At 1401, the electronic device comprises a thermal mitigation circuit operable with the first energy storage device and the second energy storage device. At 1401, the thermal mitigation circuit powers the one or more processors with more current from the first energy storage device than the second energy storage device when the one or more sensors detect a first operating condition of the electronic device and the first energy storage device is charged beyond a minimum first energy storage device charge threshold, and powers the one or more processors with more current from the second energy storage device than the first energy storage device when the one or more sensors detect a second operating condition of the electronic device and the second energy storage device is charged beyond a minimum second energy storage device charge threshold. However, at 1401 when the first energy storage device is charged less than the minimum first energy storage device charge threshold when the one or more sensors detect the first operating condition, or when the second energy storage device is charged less than the minimum second energy storage device charge threshold when the one or more sensors detect the second operating condition, the one or more processors cause the user interface to deliver a prompt.

At 1402, the first operating condition of 1401 comprises the electronic device being held by, or held predominantly by, the second device housing when the electronic device is in the axially displaced open position. At 1402, the second operating condition of 1401 comprises the electronic device being held by, or held predominantly by, the first device housing when the electronic device is in the axially displaced open position.

At 1403, the user interface of 1401 comprises a display and the one or more processors processers cause the user interface to deliver the prompt by presenting the prompt on the display. At 1404, the user interface of 1401 comprises an audio output and the one or more processors cause the user interface to deliver the prompt by audibly emitting the prompt from the audio output.

At 1405, the first operating condition of 1401 comprises the electronic device being held by, or held predominantly by, the second device housing when the electronic device is in the axially displaced open position. At 1405, the prompt instructs that the electronic device should be held by the first device housing.

At 1406, the second operating condition of 1401 comprises the electronic device being held by, or held predominantly by, the first device housing when the electronic device is in the axially displaced open position. At 1406, the prompt instructs that the electronic device should be held by the second device housing.

At 1407, the prompt of 1401 instructs that the electronic device should be turned over. At 1408, the prompt of 1401 instructs an orientation of the electronic device to be changed from portrait to landscape or vice versa.

At 1409, the one or more processors of 1401 cause the user interface to deliver a prompt only where a foreground application operating on the one or more processors is orientation agnostic. At 1410, the foreground application of 1409 operating on the one or more processors is orientation agnostic when device inversion leaves operation of the one or more sensors unaffected.

At 1411, the foreground application of 1409 is orientation sacrosanct. At 1411, the one or more processors cause the user interface to deliver another prompt. At 1412, the other prompt of 1411 explains heat generation within the electronic device.

At 1413, the thermal mitigation circuit of 1401 charges the first energy storage device with more current than the second energy storage device when the one or more sensors detect a third operating condition of the electronic device. At 1413, the thermal mitigation circuit of 1401 charges the second energy storage device with more current than the first energy storage device when the one or more sensors detect a fourth operating condition of the electronic device.

At 1414, a method in an electronic device comprises determining whether to draw more current from a first energy storage device situated in a first device housing pivotable about a hinge relative to a second device housing between an axially displaced open position and a closed position or a second energy storage device situated in the second device housing as a function of a support condition of the electronic device detected by one or more sensors of the electronic device. At 1414, the method selects a selected energy storage device to draw more current from as a result of the determining.

At 1414, the method detects whether the selected energy source is charged beyond a selected energy storage device charge threshold. At 1414, where the selected energy source is charged below the selected energy storage device charge threshold, the method causes a user interface to deliver a prompt.

At 1415, the prompt of 1414 instructs a user of the electronic device to hold another device housing of the electronic device. At 1416, the prompt of 1414 instructs a user to invert the electronic device.

At 1417, the prompt of 1414 instructs a user to change an orientation of the electronic device from one of a portrait orientation or a landscape orientation to another of the portrait orientation or the landscape orientation. At 1418, the prompt of 1414 instructs a user to place the electronic device on a surface.

At 1419, an electronic device comprises a first device housing coupled to a second device housing by a hinge and pivotable about the hinge relative to the second device housing between an axially displaced open position and a closed position. At 1419, the electronic device comprises a first energy storage device situated in the first device housing and a second energy storage device situated in the second device housing.

At 1419, the electronic device comprises one or more processors operable to perform functions of the electronic device. At 1419, the electronic device comprises a user interface operable with the one or more processors and one or more sensors operable with the one or more processors.

At 1419, the one or more processors select the first energy storage device to power the electronic device when the one or more sensors determine the electronic device is being supported by a surface or held by the second device housing and the first energy storage device is charged beyond a predefined charge threshold. At 1419, the one or more processors select the second energy storage device to power the electronic device when the electronic device is being held by the first device housing and the second energy storage device is charged beyond another predefined charge threshold.

Alternatively, at 1419 the one or more processors cause the user interface to deliver a prompt. At 1419, the prompt either instructs that the electronic device be supported differently when a foreground application operating on the one or more processors is orientation agnostic or explains heat generation within the electronic device when the foreground application is orientation sacrosanct. At 1420, the foreground application of 1419 is orientation agnostic when operation of one or more of a camera, microphone, or speaker will not be impeded when the device is supported differently in accordance with instructions provided by the prompt.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first device housing pivotable about a hinge relative to a second device housing between an axially displaced open position and a closed position;
   one or more processors;
   a user interface operable with the one or more processors;
   one or more sensors operable with the one or more processors;
   a first energy storage device situated in the first device housing and operable to power the one or more processors;
   a second energy storage device situated in the second device housing and also operable to power the one or more processors; and
   a thermal mitigation circuit operable with the first energy storage device and the second energy storage device, the thermal mitigation circuit:
      powering the one or more processors with more current from the first energy storage device than the second energy storage device when the one or more sensors detect a first operating condition of the electronic device, and the first energy storage device is charged beyond a minimum first energy storage device charge threshold; and
      powering the one or more processors with more current from the second energy storage device than the first energy storage device when the one or more sensors detect a second operating condition of the electronic device, and the second energy storage device is charged beyond a minimum second energy storage device charge threshold; and
   wherein:
      when the first energy storage device is charged less than the minimum first energy storage device charge threshold when the one or more sensors detect the first operating condition: or
      when the second energy storage device is charged less than the minimum second energy storage device charge threshold when the one or more sensors detect
      the second operating condition:
   the one or more processors cause the user interface to deliver a prompt.

2. The electronic device of claim 1, wherein:
   the first operating condition comprises the electronic device being held by, or held predominantly by, the second device housing when the electronic device is in the axially displaced open position; and
   the second operating condition comprises the electronic device being held by, or held predominantly by, the first device housing when the electronic device is in the axially displaced open position.

3. The electronic device of claim 1, wherein the user interface comprises a display and the one or more processors cause the user interface to deliver the prompt by presenting the prompt on the display.

4. The electronic device of claim 1, wherein the user interface comprises an audio output and the one or more processors cause the user interface to deliver the prompt by audibly emitting the prompt from the audio output.

5. The electronic device of claim 1, wherein the first operating condition comprises the electronic device being held by, or held predominantly by, the second device housing when the electronic device is in the axially displaced open position and the prompt instructs that the electronic device should be held by the first device housing.

6. The electronic device of claim 1, wherein the second operating condition comprises the electronic device being held by, or held predominantly by, the first device housing when the electronic device is in the axially displaced open position and the prompt instructs that the electronic device should be held by the second device housing.

7. The electronic device of claim 1, wherein the prompt instructs that the electronic device should be turned over.

8. The electronic device of claim 1, wherein the prompt instructs an orientation of the electronic device to be changed from portrait to landscape or vice versa.

9. The electronic device of claim 1, wherein the one or more processors cause the user interface to deliver a prompt only where a foreground application operating on the one or more processors is orientation agnostic.

10. The electronic device of claim 9, wherein the foreground application operating on the one or more processors is orientation agnostic when device inversion leaves operation of the one or more sensors unaffected.

11. The electronic device of claim 9, wherein when the foreground application is orientation sacrosanct, the one or more processors cause the user interface to deliver another prompt.

12. The electronic device of claim 11, the another prompt explaining heat generation within the electronic device.

13. The electronic device of claim 1, the thermal mitigation circuit:
charging the first energy storage device with more current than the second energy storage device when the one or more sensors detect a third operating condition of the electronic device; and
charging the second energy storage device with more current than the first energy storage device when the one or more sensors detect a fourth operating condition of the electronic device.

14. A method in an electronic device, the method comprising:
determining whether to draw more current from a first energy storage device situated in a first device housing pivotable about a hinge relative to a second device housing between an axially displaced open position and a closed position or a second energy storage device situated in the second device housing as a function of a support condition of the electronic device detected by one or more sensors of the electronic device:
selecting a selected energy storage device to draw more current from as a result of the determining:
detecting whether the selected energy storage device is charged beyond a selected energy storage device charge threshold; and
where the selected energy storage device is charged below the selected energy storage device charge threshold, causing a user interface to deliver a prompt.

15. The method of claim 14, the prompt instructing a user of the electronic device to hold another device housing of the electronic device.

16. The method of claim 14, the prompt instructing a user to invert the electronic device.

17. The method of claim 14, the prompt instructing a user to change an orientation of the electronic device from one of a portrait orientation or a landscape orientation to another of the portrait orientation or the landscape orientation.

18. The method of claim 14, the prompt instructing a user to place the electronic device on a surface.

19. An electronic device, comprising:
a first device housing coupled to a second device housing by a hinge and pivotable about the hinge relative to the second device housing between an axially displaced open position and a closed position:
a first energy storage device situated in the first device housing:
a second energy storage device situated in the second device housing:
one or more processors operable to perform functions of the electronic device:
a user interface operable with the one or more processors; and
one or more sensors operable with the one or more processors;
wherein the one or more processors:
select the first energy storage device to power the electronic device when the one or more sensors determine the electronic device is being supported by a surface or held by the second device housing and the first energy storage device is charged beyond a predefined charge threshold;
select the second energy storage device to power the electronic device when the electronic device is being held by the first device housing and the second energy storage device is charged beyond another predefined charge threshold; or
cause the user interface to deliver a prompt:
instructing that the electronic device be supported differently when a foreground application operating on the one or more processors is orientation agnostic; or
explain heat generation within the electronic device when the foreground application is orientation sacrosanct.

20. The electronic device of claim 19, wherein the foreground application is orientation agnostic when operation of one or more of a camera, microphone, or speaker will not be impeded when the electronic device is supported differently in accordance with instructions provided by the prompt.

* * * * *